(12) United States Patent
Ma et al.

(10) Patent No.: US 11,621,209 B2
(45) Date of Patent: Apr. 4, 2023

(54) SEMICONDUCTOR DEVICE THERMAL BUMP

(71) Applicant: QUALCOMM Incorporated, San Diego, CA (US)

(72) Inventors: Lei Ma, Palo Alto, CA (US); Wenyue Lydia Zhang, San Diego, CA (US); Antonino Scuderi, San Diego, CA (US); William Clinton Burling Peatman, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 17/404,590

(22) Filed: Aug. 17, 2021

(65) Prior Publication Data
US 2023/0054893 A1      Feb. 23, 2023

(51) Int. Cl.
*H01L 23/367* (2006.01)
*H01L 27/102* (2006.01)
*H01L 23/00* (2006.01)

(52) U.S. Cl.
CPC ............ *H01L 23/367* (2013.01); *H01L 24/13* (2013.01); *H01L 27/1022* (2013.01); *H01L 2224/1302* (2013.01)

(58) Field of Classification Search
CPC .................................................. H01L 23/367
See application file for complete search history.

(56) References Cited

U.S. PATENT DOCUMENTS

| | | | | |
|---|---|---|---|---|
| 9,379,077 | B2* | 6/2016 | Lin | .......................... H01L 24/11 |
| 9,548,282 | B2* | 1/2017 | Lin | .......................... H01L 24/16 |
| 10,468,377 | B2* | 11/2019 | Yu | ........................... H01L 24/05 |
| 2014/0077374 | A1* | 3/2014 | Lin | ....................... H01L 23/481 |
| | | | | 257/E21.586 |
| 2014/0312390 | A1 | 10/2014 | Tsai et al. | |
| 2015/0214127 | A1* | 7/2015 | Gu | ........................... H01L 24/83 |
| | | | | 438/118 |
| 2017/0092558 | A1* | 3/2017 | Mittal | ................. H01L 25/0657 |
| 2017/0117270 | A1 | 4/2017 | McPartlin et al. | |
| 2019/0172773 | A1 | 6/2019 | Kurokawa et al. | |
| 2019/0172806 | A1 | 6/2019 | Kurokawa | |
| 2019/0198464 | A1 | 6/2019 | Tsutsui et al. | |
| 2020/0235026 | A1 | 7/2020 | Kurokawa et al. | |
| 2021/0035922 | A1 | 2/2021 | Tokuya et al. | |

OTHER PUBLICATIONS

International Search Report and Written Opinion—PCT/US2022/073916—ISA/EPO—dated Nov. 16, 2022.

* cited by examiner

*Primary Examiner* — William A Harriston
(74) *Attorney, Agent, or Firm* — Qualcomm Incorporated

(57) ABSTRACT

Disclosed is a semiconductor device such as a power amplifier. Unlike conventional power amplifiers, thermal bump is patterned to only cover active devices. In this way, dimensions of the semiconductor device can be reduced.

30 Claims, 26 Drawing Sheets

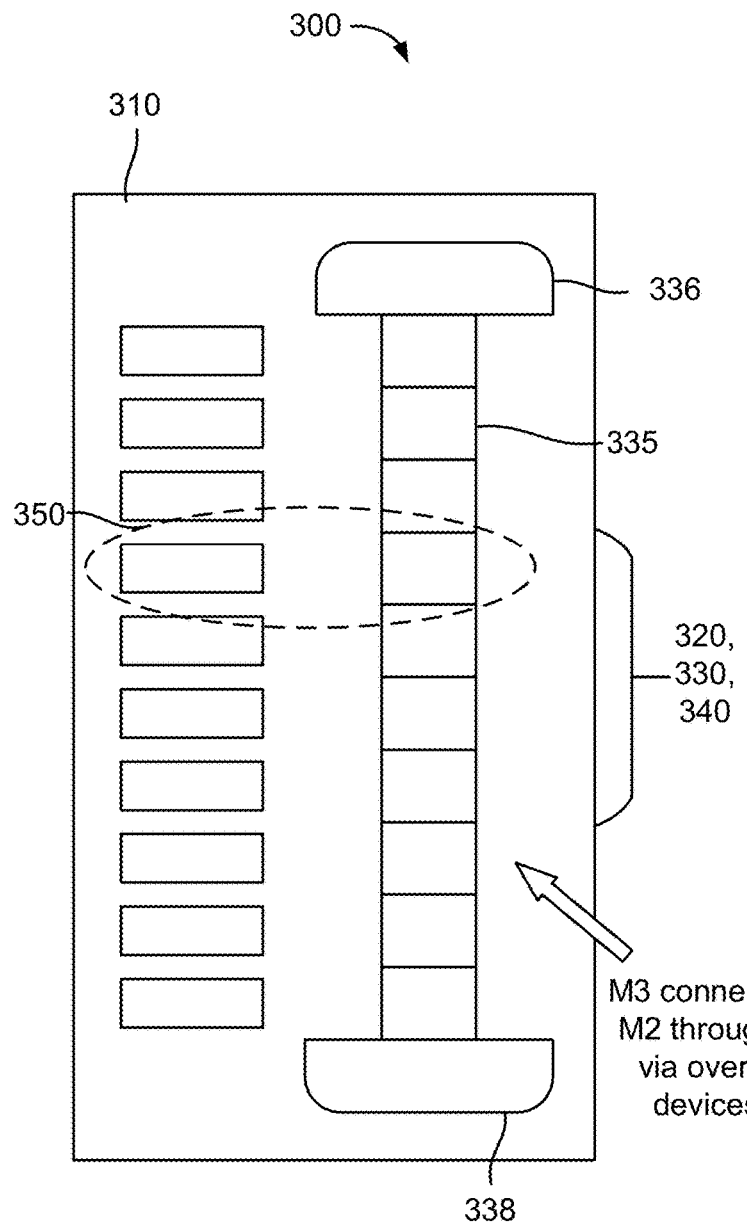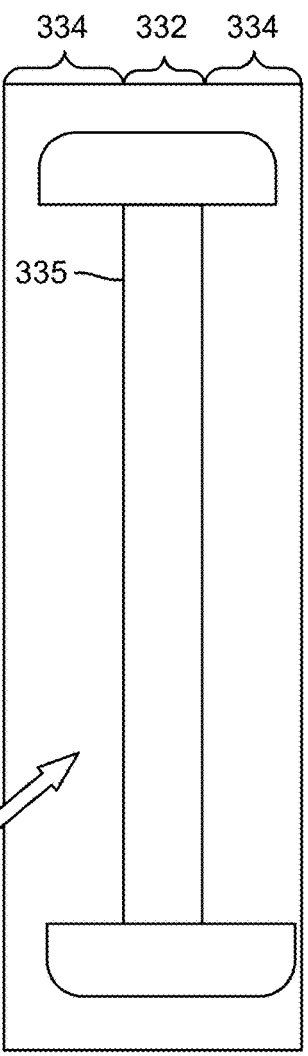
*FIG. 3A*  *FIG. 3B*

SEMICONDUCTOR DEVICE THERMAL BUMP

FIELD OF DISCLOSURE

This disclosure relates generally to semiconductor devices, and more particularly, but not exclusively, to thermal bumps in semiconductor devices such as power amplifiers and fabrication techniques thereof.

BACKGROUND

Integrated circuit technology has achieved great strides in advancing computing power through miniaturization of active and passive components. The package devices can be found in many electronic devices, including processors, servers, radio frequency (RF) integrated circuits, etc. Packaging technology becomes cost-effective in high pin count devices and/or high production volume components.

In today's radio frequency frontend (RFFE) modules, power amplifiers (PA) can take up substantial amount of real estate of the module. For example, a gallium arsenide (GaAs) PA can occupy about 1000 μm×1000 μm area. Accordingly, there is a need for systems, apparatus, and methods that overcome the deficiencies of conventional PA designs including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary semiconductor device is disclosed. The semiconductor device may comprise a plurality of unit cells comprising a plurality of active devices on a substrate. The plurality of active devices may have a first width in a first direction and be aligned along a first length in a second direction. The semiconductor device may also comprise a first metal layer patterned to form a plurality of thermal pads on the plurality of active devices. The semiconductor device may further comprise a second metal layer patterned to form first and second thermal bump ends and a thermal bump connected therebetween. The thermal bump may have a second width in the first direction and a second length in the second direction. The thermal bump may be formed on the plurality of thermal pads. The semiconductor device may yet comprise a third metal layer patterned to form a thermal bar on the thermal bump. The semiconductor device may yet further comprise a thermal pillar formed on the thermal bar. The plurality of active devices may be thermally coupled to the thermal pillar through the plurality of thermal pads, the thermal bump, and the thermal bar. The first and second thermal bump ends each may have a width greater than the second width. A region between the first and second thermal bump ends may be divided into active and non-active regions. The active region may be a portion of the region occupied by the thermal bump, and the non-active region may be a remainder portion of the region. The second width and the second length of the thermal bump may be oriented such that the active region overlaps the first width and the first length of the plurality of active devices.

A method of fabricating a semiconductor device is disclosed. The method may comprise forming a plurality of unit cells comprising a plurality of active devices on a substrate. The plurality of active devices may have a first width in a first direction and be aligned along a first length in a second direction. The method may also comprise patterning a first metal layer to form a plurality of thermal pads on the plurality of active devices. The method may further comprise patterning a second metal layer to form first and second thermal bump ends and a thermal bump connected therebetween. The thermal bump may have a second width in the first direction and a second length in the second direction. The thermal bump may be formed on the plurality of thermal pads. The method may yet comprise patterning a third metal layer to form a thermal bar on the thermal bump. The method may yet further comprise forming a thermal pillar formed on the thermal bar. The plurality of active devices may be thermally coupled to the thermal pillar through the plurality of thermal pads, the thermal bump, and the thermal bar. The first and second thermal bump ends each may have a width greater than the second width. A region between the first and second thermal bump ends may be divided into active and non-active regions. The active region may be a portion of the region occupied by the thermal bump, and the non-active region may be a remainder portion of the region. The second width and the second length of the thermal bump may be oriented such that the active region overlaps the first width and the first length of the plurality of active devices.

Another exemplary semiconductor device is disclosed. The semiconductor device may comprise a plurality of unit cells comprising a plurality of active devices on a substrate. The plurality of active devices may have a first width in a first direction and be aligned along a first length in a second direction. The semiconductor device may also comprise a first metal layer patterned to form a plurality of thermal pads on the plurality of active devices. The semiconductor device may further comprise a second metal layer patterned to form first and second thermal bump ends and a thermal bump connected therebetween. The thermal bump may have a second width in the first direction and a second length in the second direction. The thermal bump may be formed on the plurality of thermal pads. The semiconductor device may yet comprise a thermal pillar formed on the thermal bump. The plurality of active devices may be thermally coupled to the thermal pillar through the plurality of thermal pads and the thermal bump. The first and second thermal bump ends each may have a width greater than the second width. A region between the first and second thermal bump ends may be divided into active and non-active regions. The active region may be a portion of the region occupied by the thermal bump, and the non-active region may be a remainder portion of the region. The second width and the second length of the thermal bump may be oriented such that the active region overlaps the first width and the first length of the plurality of active devices.

A method of fabricating a semiconductor device is disclosed. The method may comprise forming a plurality of unit cells comprising a plurality of active devices on a substrate. The plurality of active devices may have a first width in a first direction and be aligned along a second length in a second direction. The method may also comprise patterning a first metal layer to form a plurality of thermal pads on the plurality of active devices. The method may further comprise patterning a second metal layer to form first and second thermal bump ends and a thermal bump connected therebetween. The thermal bump may have a second width in the first direction and a second length in the second direction. The thermal bump may be formed on the plurality of thermal pads. The method may yet comprise forming a thermal pillar on the thermal bump. The plurality of active devices may be thermally coupled to the thermal pillar through the plurality of thermal pads and the thermal bump. The first and second thermal bump ends each may have a width greater than the second width. A region between the first and second thermal bump ends may be divided into active and non-active regions. The active region may be a portion of the region occupied by the thermal bump, and the non-active region may be a remainder portion of the region. The second width and the second length of the thermal bump may be oriented such that the active region overlaps the first width and the first length of the plurality of active devices.

Other features and advantages associated with the apparatus and methods disclosed herein will be apparent to those skilled in the art based on the accompanying drawings and

DETAILED DESCRIPTION BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 3A and 3B illustrate an X-Y plane view of an example semiconductor device in accordance with one or more aspects of the disclosure.

Figures 1A, 1B:
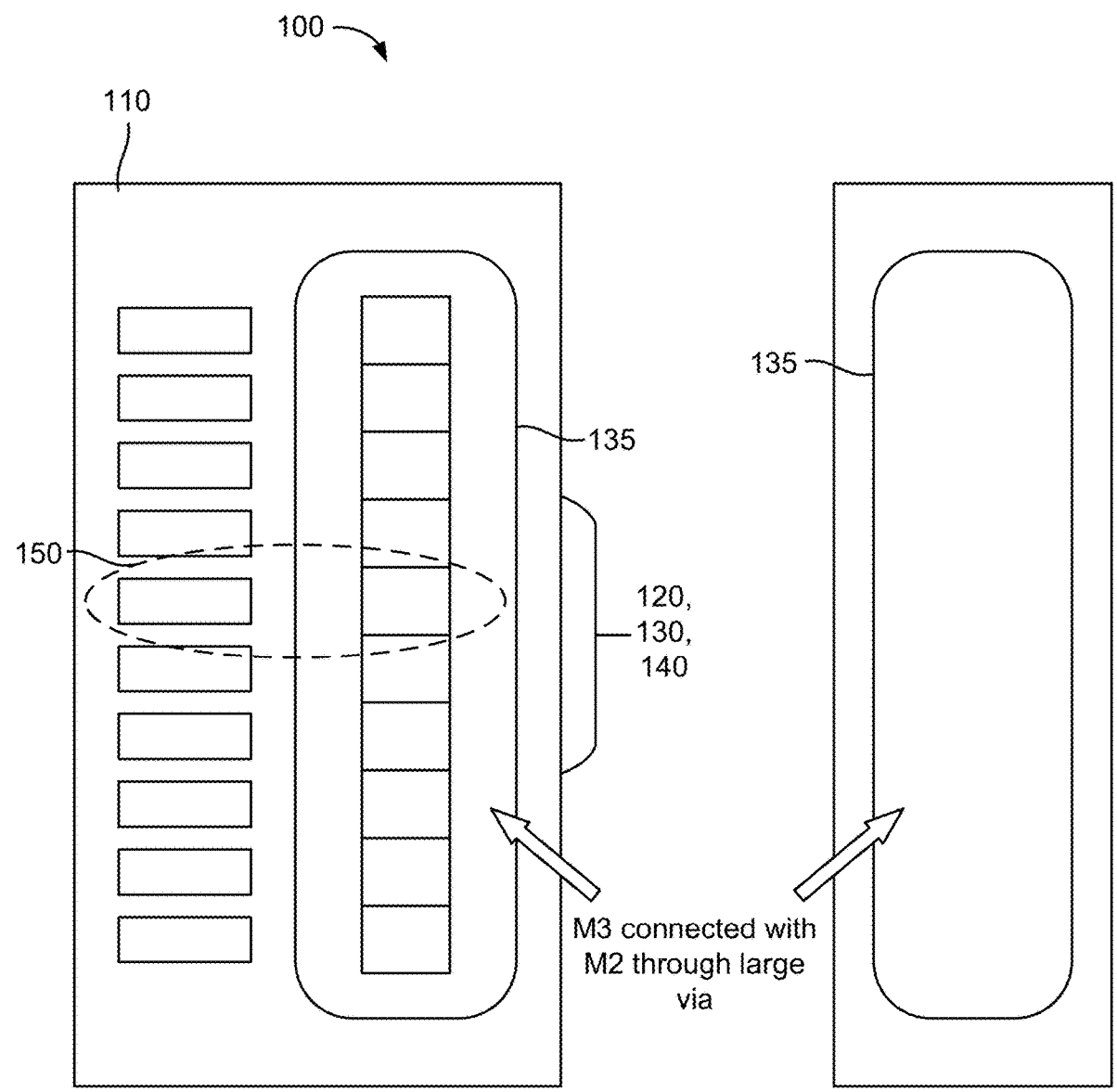
FIGS. 1A, 1B and 2 illustrate an X-Y plane view of a conventional power amplifier.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

As indicated above, PAs can take up substantial amount of real estate of an RFFE module. For example, a GaAs PA can occupy about 1000 μm×1000 μm area. Such a big design size can be costly as GaAs is more expensive than silicon (Si). To address such issues, it is proposed to reduce the size by patterning a thermal bump only, or substantially only over the active devices.

FIG. 1A illustrates an X-Y plane view of a conventional power amplifier (PA) 100. As seen, the conventional PA 100 comprises a plurality of unit cells 150 formed on a substrate 110. The plurality of unit cells 150 comprises a plurality of active devices (more on this below). The PA 100 also comprises first, second, and third metal layers 120, 130, 140 patterned on the substrate 110 and on the plurality of active devices. In the conventional PA 100, a thermal bump 135 is formed with second and third metal layers 130, 140. A portion of the second metal layer 130 corresponding to the bump 135 is connected with the third metal layer 140 through a large via as illustrated in FIG. 1B.

Figure 2:
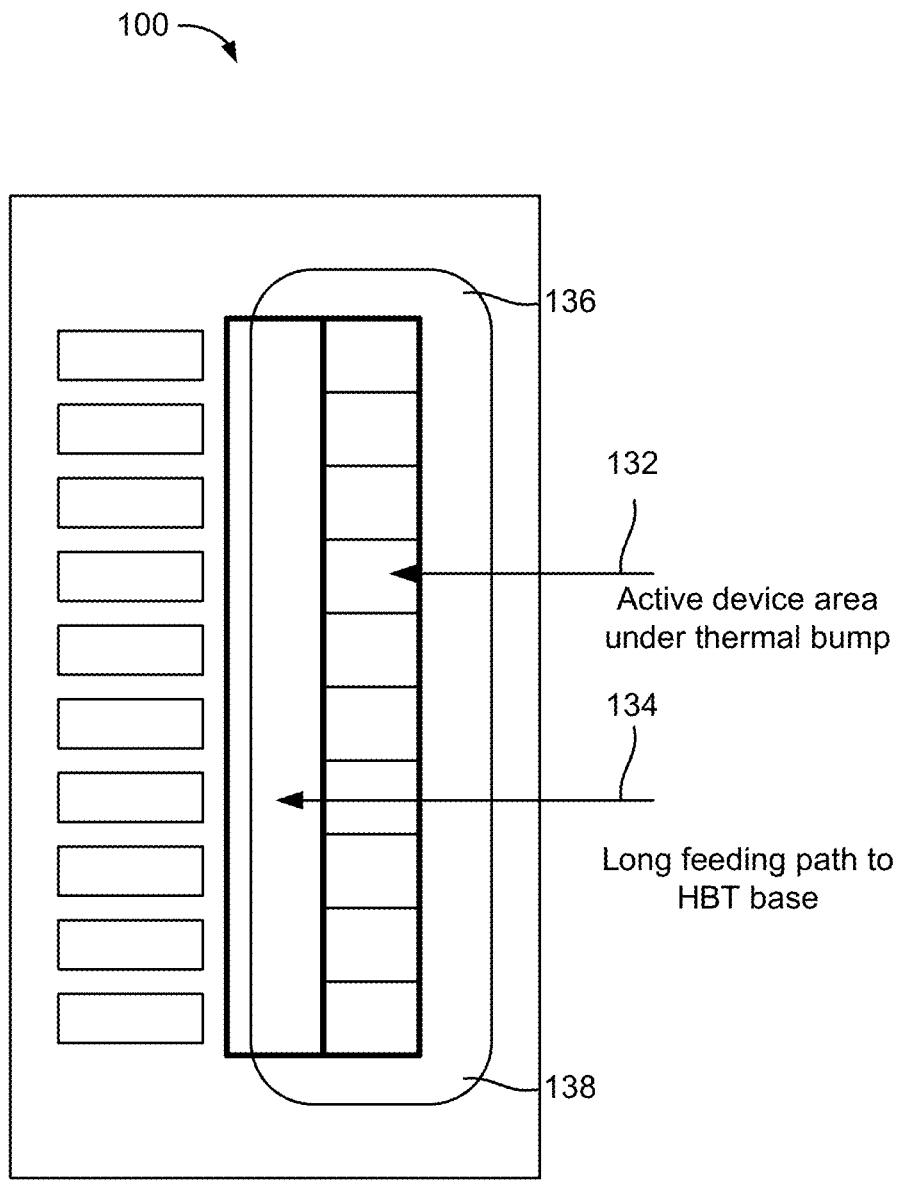

FIG. 2 also illustrates an X-Y plane view of the conventional PA 100 to illustrate one or more issues associated with the conventional PA. In FIG. 2, the thermal bump 135 is shown to be connected to first and second thermal bump ends 136, 138. A region between the first and second thermal bump ends 136, 138 includes an active region 132 and a non-active region 134. In this instance, the second metal layer 130, from which the thermal bump 135 is formed, covers or overlaps both the active and non-active regions 132, 134. This means that a long feeding path to a base of a heterojunction bipolar transistor (an example of an active device) becomes necessary. This is mostly a wasted space under thermal bump 135.

FIGS. 3A and 3B illustrate an X-Y plane view of a semiconductor device 300, e.g., a power amplifier, that addresses one or more issues of the conventional PA 100. As seen, the semiconductor device 300 may comprise a plurality of unit cells 350 formed on a substrate 310. The plurality of unit cells 350 comprises a plurality of active devices 355 (again, more on this below). The plurality of active devices 355 may have a first width in a first direction (e.g., X direction) and may be aligned along a first length in a second direction (e.g., Y direction) (not shown).

Figure 6A:
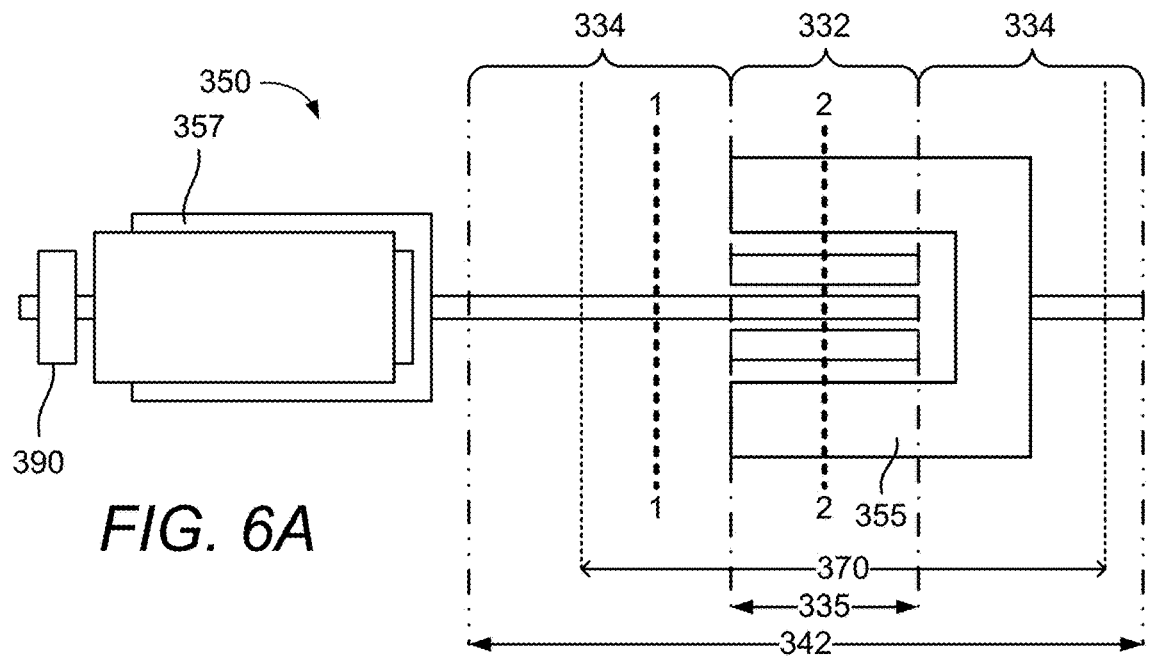
FIGS. 6A, 6B and 6C illustrate an X-Y plane view and cross-sectional views of an example unit cell of a semiconductor device in accordance with one or more aspects of the disclosure.
Figure 6B:
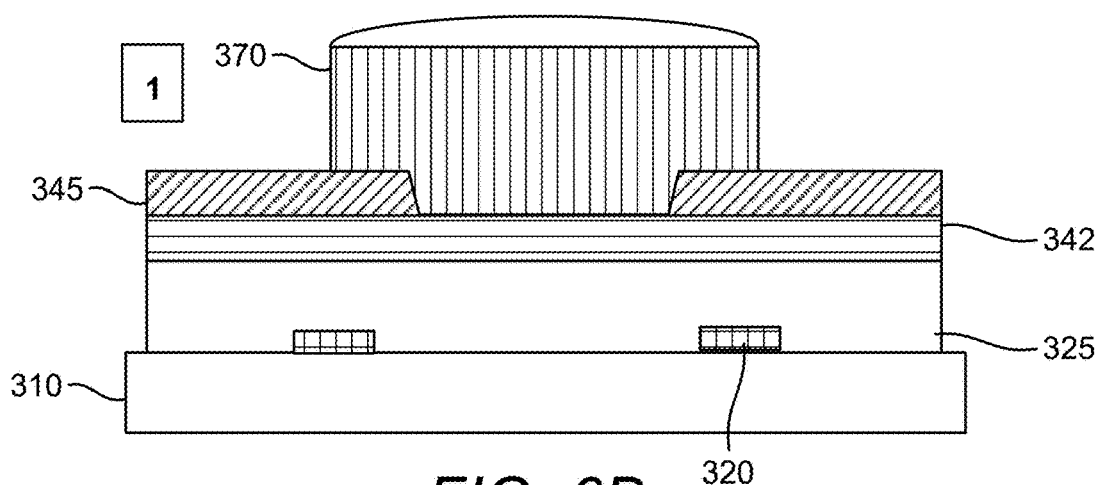
Figure 6C:
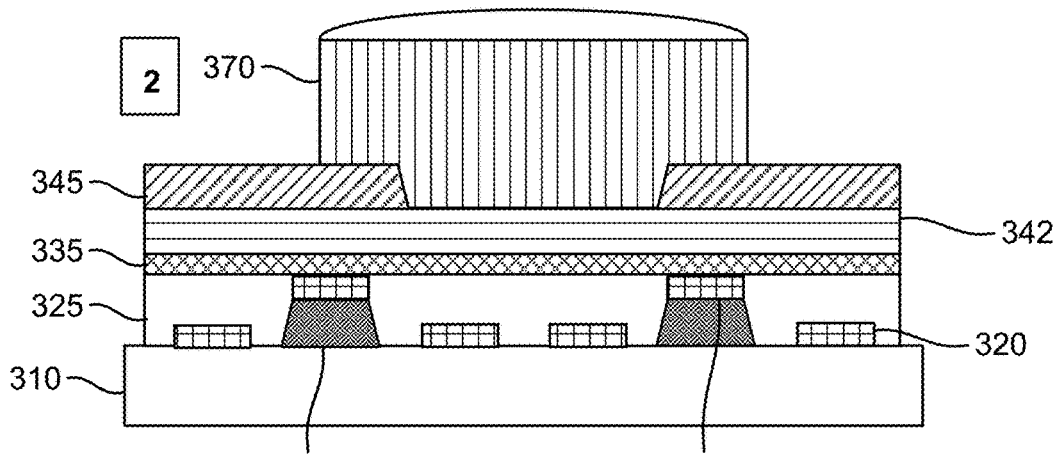
Figure 7A:
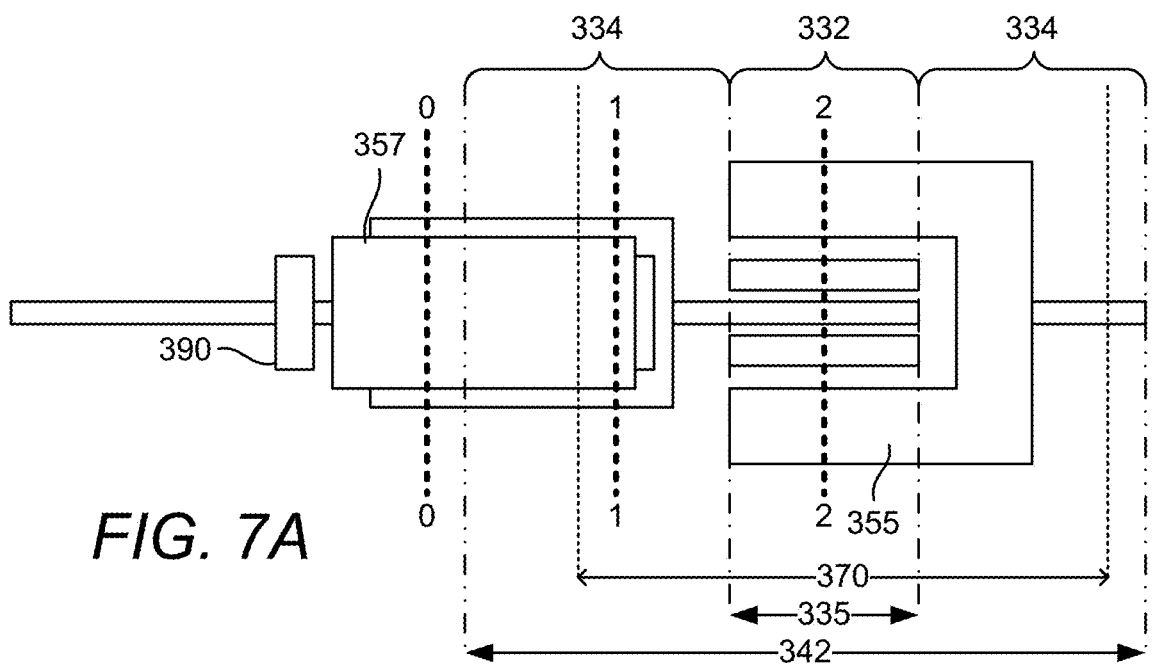
FIGS. 7A, 7B, 7C and 7D illustrate an X-Y plane view and cross-sectional views of another example unit cell of a semiconductor device in accordance with one or more aspects of the disclosure.
Figure 7B:
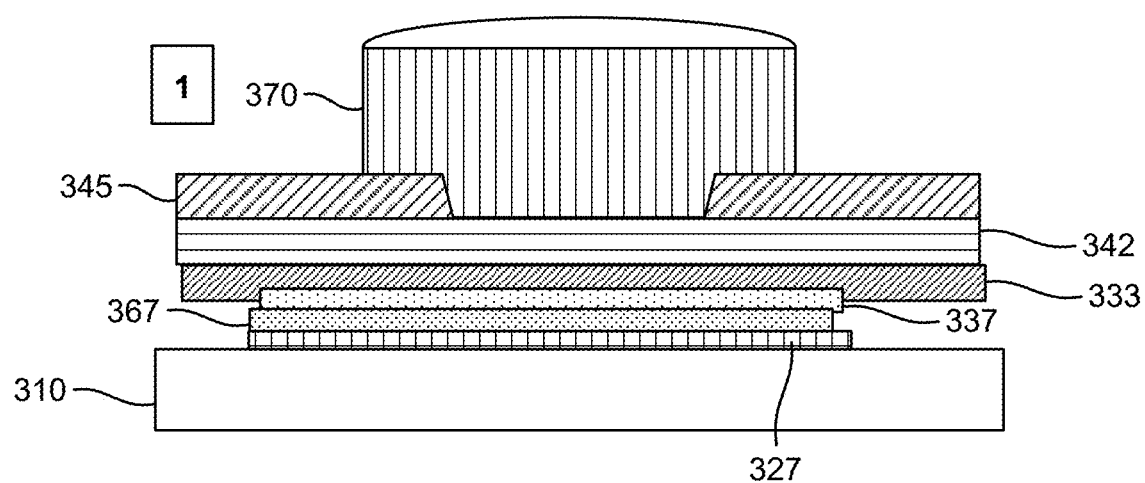
Figure 7C:
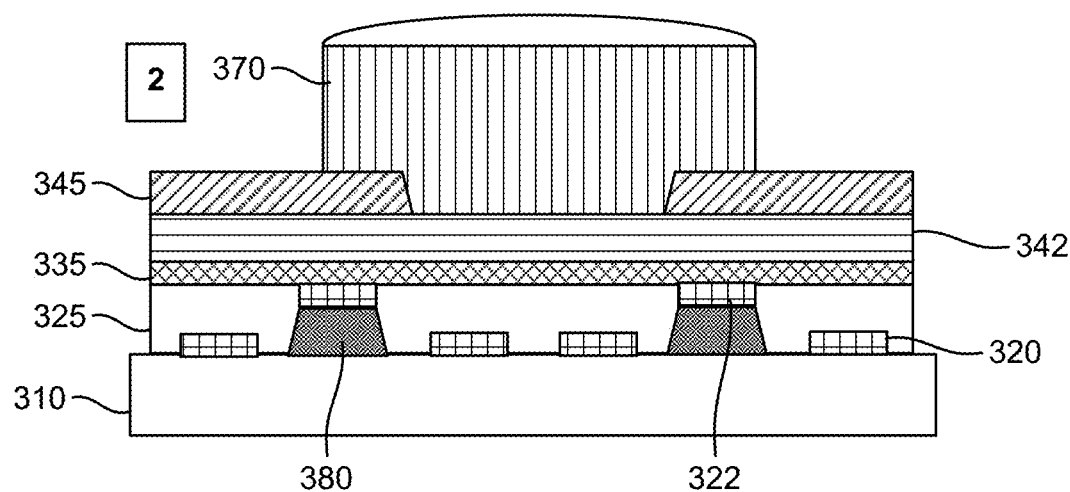

The semiconductor device 300 may also comprise first, second, and third metal layers 320, 330, 340 patterned on the substrate 310 and on the plurality of active devices 355 (e.g., see also FIGS. 6C, 7C, etc.). The first metal layer 320 may be patterned to form a plurality of thermal pads 322 on the plurality of active devices 355.

The second metal layer 330 may be patterned to form a thermal bump 335 on the plurality of thermal pads 322 (e.g., see FIGS. 6C, 7C, etc.). Compared with the conventional PA 100, the thermal bump 335 may be connected to the third metal layer 340 through a much smaller via as illustrated in FIG. 3B. The thermal bump 335 may have a second width in the first direction and a second length in the second direction.

The second metal layer 330 may also patterned to form first and second thermal bump ends 336, 338 with the thermal bump 335 connected therebetween. The first and second thermal bump ends 336, 338 may each have a width greater than the second width. Also, for ease of explanation, a region between the first and second thermal bump ends 336, 338 may be divided into active and non-active regions 332, 334. The active region 332 may be viewed as being a portion of the region occupied by the thermal bump 335, and the non-active region 334 may be viewed as being a remainder portion of the region. The second width and the second length of the thermal bump 335 may be oriented such that the active region 332 overlaps the first width and the first length of the plurality of active devices 355. Indeed, the thermal bump 335 may completely overlap the plurality of active devices 355. At a minimum, the second width of the thermal bump 335 may be equal or substantially equal to the first width of the plurality of active devices 355.

The third metal layer M3 may be patterned to form a thermal bar 342 (e.g., see FIGS. 6B, 6C, 7B, 7C, etc.) on the thermal bump 335. In an aspect, the plurality of active devices 355 are thermally coupled to the thermal pillar 370 through the plurality of thermal pads 322, the thermal bump 335, and the thermal bar 342. For example, they may be in physical contact with each other. For example, the plurality of thermal pads 322 may be on and in contact with the plurality of active devices 355. Alternatively, or in addition thereto, the thermal bump 335 may be on and in contact with the plurality of thermal pads 322. Also alternatively or in addition thereto, the thermal bar 342 maybe on and in contact with the thermal bump 335. Further alternatively or in addition thereto, the thermal pillar 370 maybe formed on and in contact with the thermal bar 342.

Figures 4A, 4B:
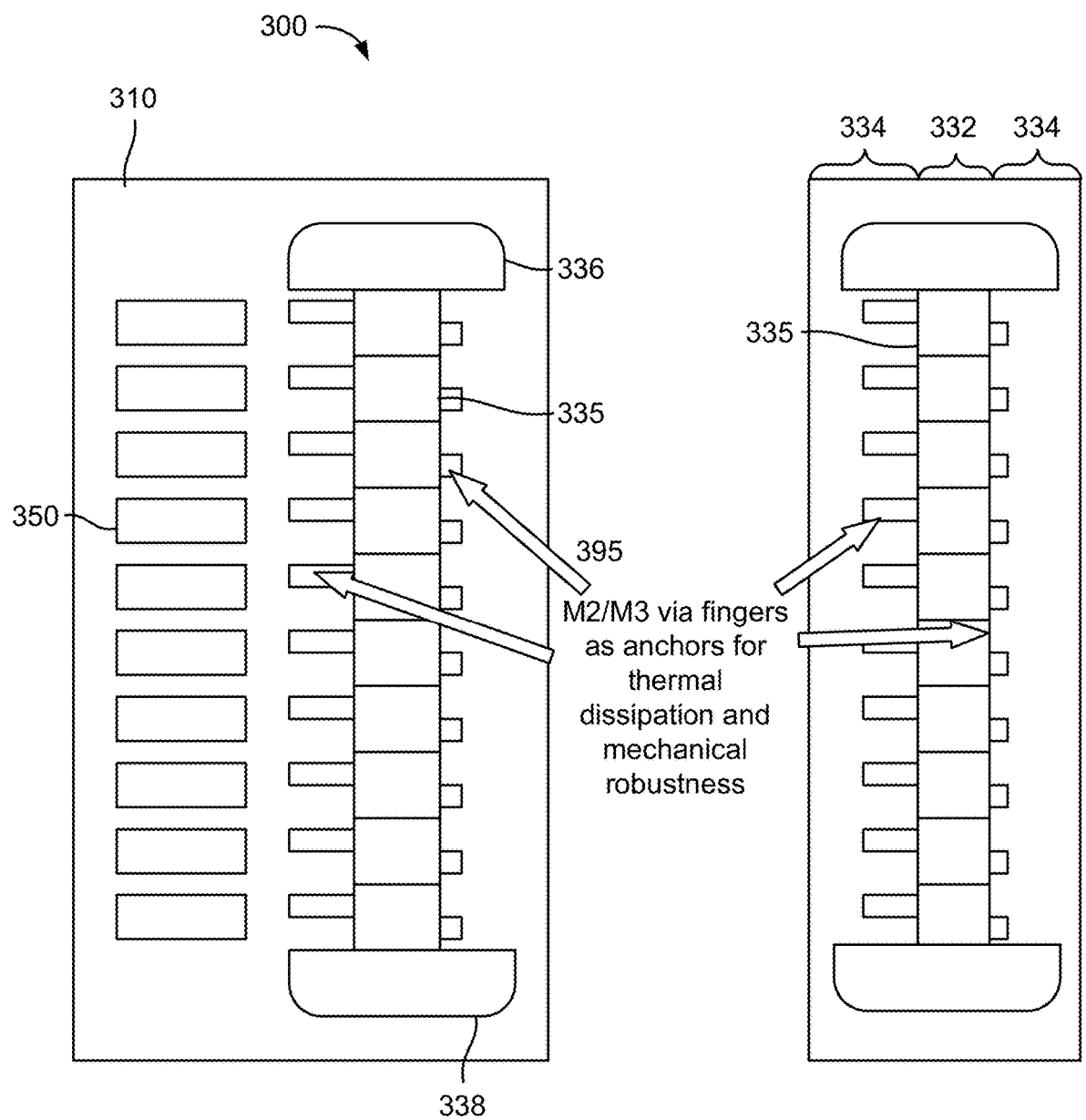
FIGS. 4A and 4B illustrate an X-Y plane view of another example semiconductor device in accordance with one or more aspects of the disclosure.

FIGS. 4A and 4B illustrate an X-Y plane view of another example semiconductor device in accordance with one or more aspects of the disclosure. In this example, the semiconductor device may also comprise one or more thermal fingers 395 formed from the second metal layer 330. The one or more thermal fingers 395 may be connected to and extend from the thermal bump 335 in the first direction into the non-active region 334. This can enhance thermal dissipation capabilities and increase mechanical robustness of the semiconductor device 300.

Figure 5A:
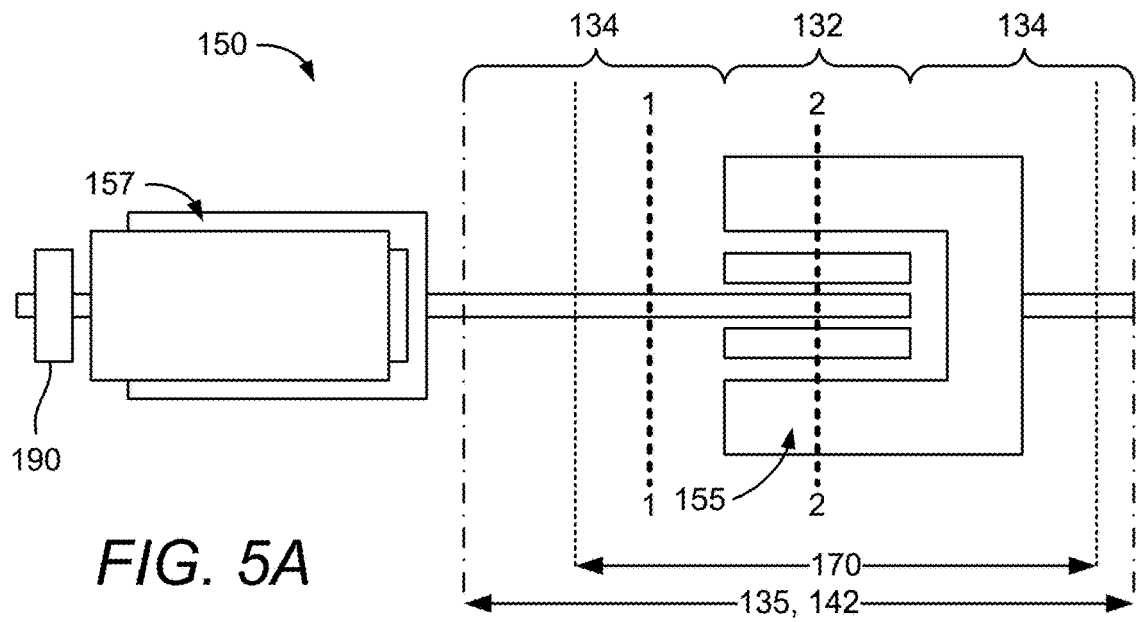
FIGS. 5A, 5B and 5C illustrate an X-Y plane view and cross-sectional views of a conventional unit cell of a conventional power amplifier.
Figure 5B:
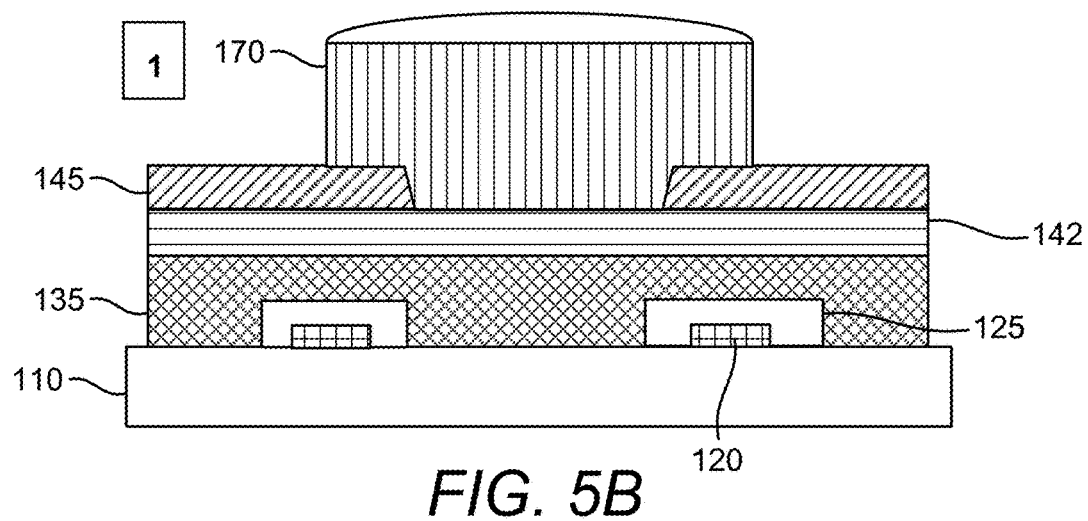
Figure 5C:
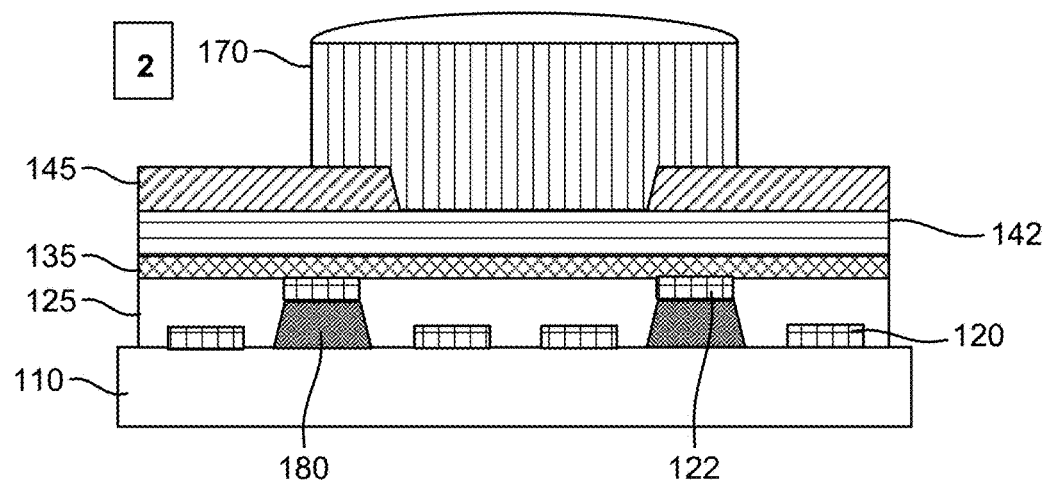

Unit cell will be further described. FIGS. 5A, 5B and 5C illustrate an X-Y plane view and cross-sectional views of a conventional unit cell 150 of a conventional power amplifier. As seen in FIG. 5A, the conventional unit cell 150 comprises a resistor 190, an active device 155 and a capacitor 157 adjacent in the X direction from the active device 155. Also shown are the active and non-active regions 132, 134. Further, widths of a thermal pillar 170, a thermal bump 135, and a thermal bar 142 are also illustrated. Note that in the conventional three metal layer unit cell 150, all of the thermal bump 135, the thermal bar 142, and the thermal pillar 170 occupy both active and non-active regions 132, 134.

FIG. 5B illustrates a cross-section of the unit cell 150 along the line "1-1" in the non-active region 134. In this cross-section, the conventional unit cell 150 comprises a substrate 110, patterned first metal layer 120, dielectric 125, patterned second and third metal layers forming the conventional thermal bump 135 and thermal bar 142, final passivation 145, and thermal pillar 170.

FIG. 5C illustrates a cross-section of the unit cell 150 along the line "2-2" in the active region 132. In this cross-section, the unit cell 150 comprises the substrate 110, transistor 180, thermal pad 122, the dielectric 125, the thermal bump 135, the thermal bar 142, the final passivation 145, and the thermal pillar 170.

FIGS. 6A, 6B and 6C illustrate an X-Y plane view and cross-sectional views of an example unit cell 350 of a semiconductor device 300 (e.g., a power amplifier (PA)) in accordance with one or more aspects of the disclosure. As seen in FIG. 6A, the unit cell 350 may comprise an active device 355 and a capacitor 357 adjacent in the first direction (e.g., X direction) from the active device 355. The unit cell 350 may comprise one or more resistors 390 in addition to the active device 355 and the capacitor 357.

Also shown are the active and non-active regions 332, 334. Further, widths of a thermal pillar 370, a thermal bump 335 (e.g., formed from patterning second metal layer 330), and a thermal bar (e.g., formed from patterning third metal layer 340) are also illustrated. Note that unlike the conventional PA 100, the thermal bump 335 covers or substantially covers only the active device 355. This implies that the second width of the thermal bump 335 is equal to or substantially equal to the first width of the plurality of active devices 355.

FIG. 6B illustrates a cross-section of the unit cell 350 along the line "1-1" in the non-active region 334. In this cross-section, the unit cell 350 may comprise a substrate 310, patterned first metal layer 320, a dielectric 325, the thermal bar 342 (e.g., formed from patterned third metal layer 340), final passivation 345, and thermal pillar 370.

FIG. 6C illustrates a cross-section of the unit cell 350 along the line "2-2" in the active region 332. In this cross-section, the unit cell 350 may comprise the substrate 310, transistor 380, the patterned first metal layer 320 on the substrate 310, thermal pad 322 (e.g., formed from first metal layer 320) on the transistor 380, the dielectric 325, the thermal bump 335, the thermal bar 342, the final passivation 345, and the thermal pillar 370.

Note that in FIG. 5B, the second metal layer 130 is still present in the non-active region 134 of the conventional unit cell 150. However, in the example unit cell 350 of FIG. 6B, the second metal layer 330 is NOT present in the non-active region 334. This enables desirable traits to be realized, as will be described further.

In an aspect, the active devices 355 of one or more unit cells 350 may be bipolar transistors such as heterojunction bipolar transistor (HBT), high electron mobility transistor (HEMT) such as pHEMT, etc. This is illustrated in FIGS. 7A-7D. The unit cell 350 of FIG. 7A may comprise similar components as the unit cell 350 of FIG. 6A. That is, the unit cell 350 of FIG. 7A may comprise an active device 355, a capacitor 357 adjacent in the first direction (e.g., X direction) from the active device 355, and one or more resistors 390. Also shown are the active and non-active regions 332, 334 and the widths of the thermal pillar 370, the thermal bump 335, and the thermal bar 342.

In this instance, at least a portion of the of the capacitor 357 may be in the non-active region 334, i.e., much closer to the active device 355. This is enabled since the second metal layer 330 is not within the non-active region 334. This enables a reduction in size of the semiconductor device 300 in the first direction (e.g., X direction). For example, the size reduction can be 30-50 μm in the first direction.

FIG. 7B illustrates a cross-section of the unit cell 350 along the line "1-1" in the non-active region 334. In this cross-section, the unit cell 350 may include the capacitor 357, which may comprise a lower plate 327, an upper plate 337, and a capacitor dielectric 367 between the lower and upper plates 327, 337. The first metal layer 320 may be patterned to form the lower plate 327. The second metal layer 330 or some other metal layer may be patterned to form the upper plate 337. That is, the upper plate 337 may be electrically coupled to or patterned from the second metal layer 330. Above the upper plate 337, the unit cell 350 may further comprise the thermal bar 342, the final passivation 345, and the thermal pillar 370. A dielectric 333 may be formed between the upper plate 337 and the thermal bar 342.

FIG. 7C illustrates a cross-section of the unit cell 350 along the line "2-2" in the active region 332. This cross-section is similar to the cross-section illustrated in FIG. 6C.

Figure 7D:
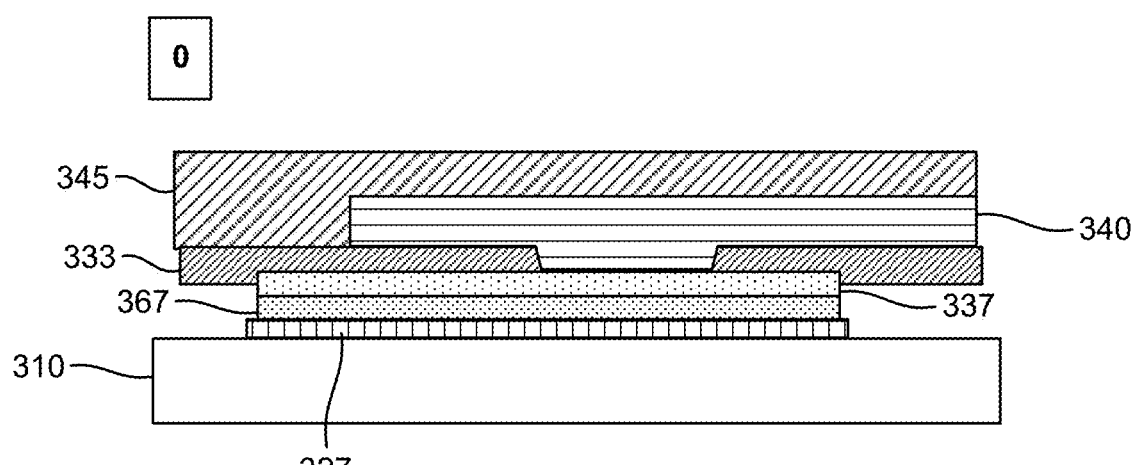

FIG. 7D illustrates a cross-section of the unit cell 350 along the line "0-0" outside the active and non-active regions 332, 334. This cross-section illustrates the capacitor 357 as described with respect to FIG. 7B. But in this instance, the patterned third metal layer 340 may be electrically coupled with the upper plate 337.

Figure 8A:
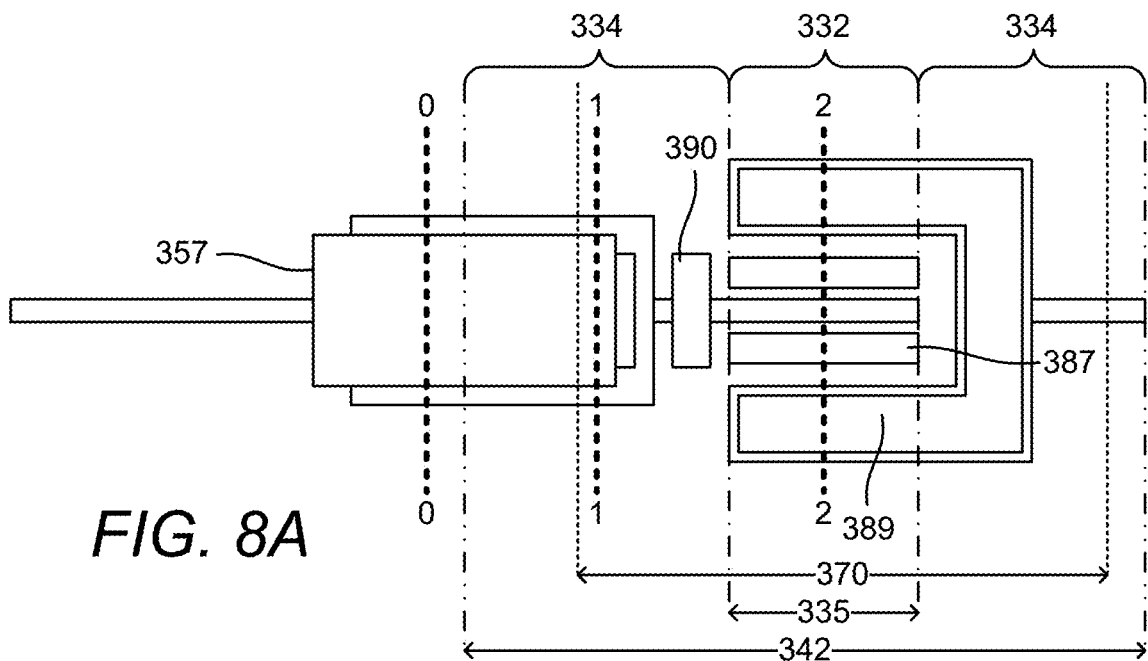
FIGS. 8A, 8B, 8C and 8D illustrate an X-Y plane view and cross-sectional views of another example unit cell of a semiconductor device in accordance with one or more aspects of the disclosure.

FIGS. 8A, 8B, 8C and 8D illustrate an X-Y plane view and cross-sectional views of another example unit cell 350 of a semiconductor device in accordance with one or more aspects of the disclosure. Here, it may be assumed that that the active device 355 is a bipolar transistor such as an HBT. As seen in FIG. 8A, the transistor 380 may comprise an emitter 387 and a collector 389.

Again, the active and non-active regions 332, 334 as well as the widths of the thermal pillar 370, the thermal bump 335, and the thermal bar 342 are shown. In this instance, at least a portion of the of the capacitor 357 may be in the non-active region 334, i.e., much closer to the active device 355. Thus, similar to the unit cell of FIGS. 7A-7B, a reduction in size of the semiconductor device 300 in the first direction (e.g., X direction) is enabled. In addition, one or more resistors 390 (e.g., ballasting resistors) may be in the non-active region 334 as well. Again, this is enabled since the second metal layer 330 is not within the non-active region 334.

Figure 8B:
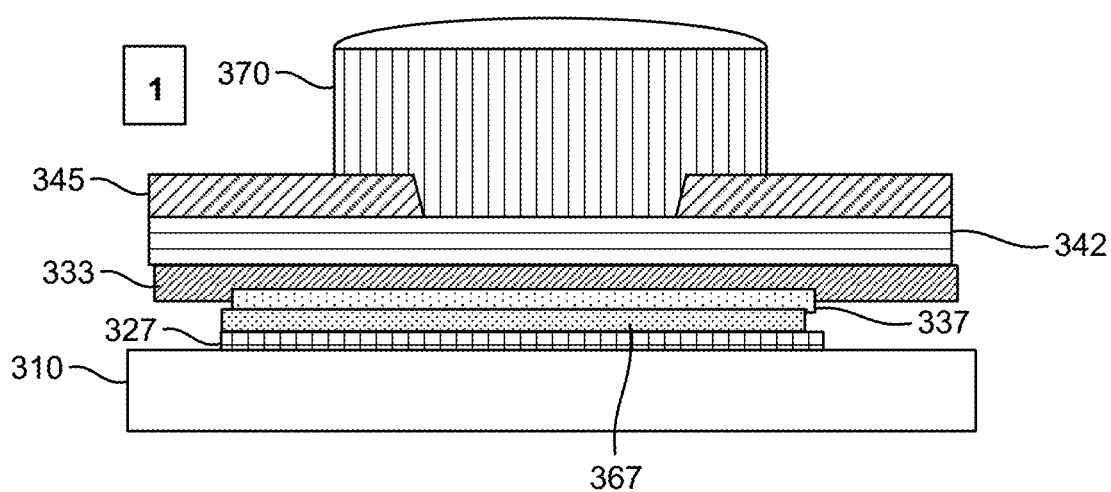

FIG. 8B illustrates a cross-section of the unit cell 350 along the line "1-1" in the non-active region 334. This cross-section is similar to the cross-section illustrated in FIG. 7B, and thus will not be described further.

Figure 8C:
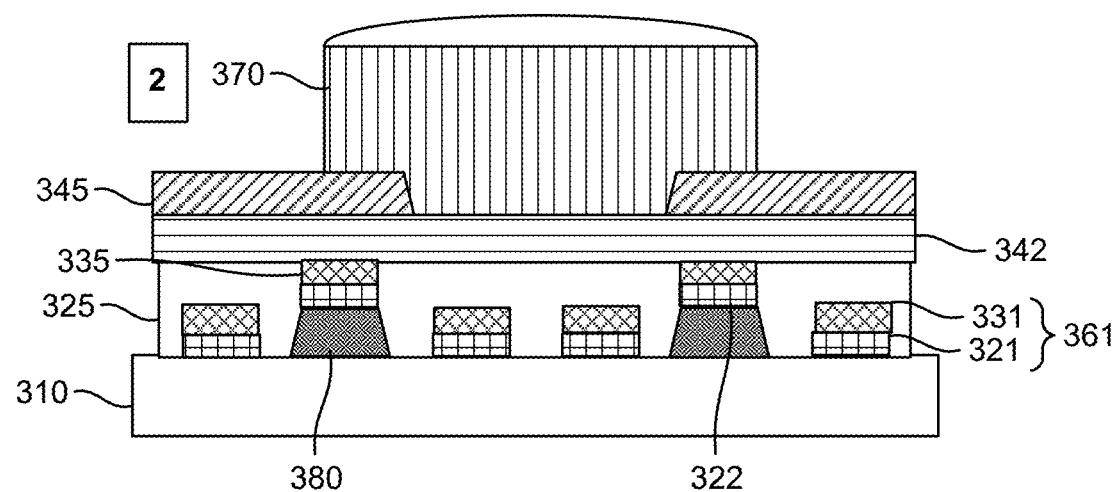
Figure 8D:
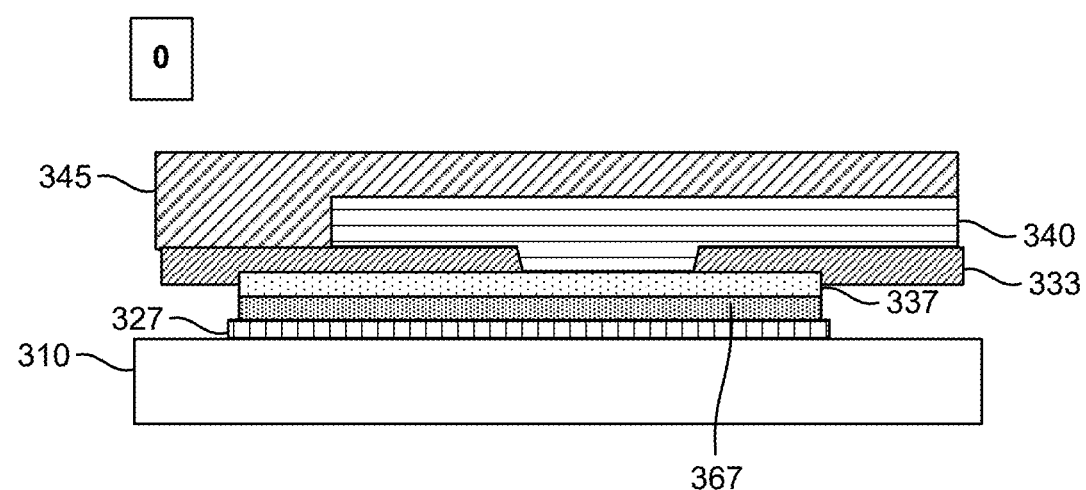

FIG. 8D illustrates a cross-section of the unit cell 350 along the line "0-0" in the region outside of the active and non-active regions 332, 334. This cross-section is similar to the cross-section illustrated in FIG. 7D, and thus will not be described further.

FIG. 8C illustrates a cross-section of the unit cell 350 along the line "2-2" in the active region 332. As seen, the emitter 387 may be thermally coupled to the thermal bump 335 through the thermal pad 322 corresponding to the active device 355. Also, the collector 389 may not be electrically coupled to the thermal bump 335. A collector pad 361 may be formed on and electrically coupled with the collector 389. The collector pad 361 may comprise a first collector pad 321, formed from patterned first metal layer 320, may be on the collector 389. The collector pad 361 may also comprise a second collector pad 331, formed from patterned second metal layer 330, on the first collector pad 321. This enables the current capacity of the collector 389 to be enhanced. This in turn enables a reduction in the size of the semiconductor device 300 in the second direction (e.g., Y direction). The unit cell 350 may further comprise the dielectric 325, the thermal bar 342, the final passivation 345, and the thermal pillar 370.

Note that in FIG. 8A, the collector 389 may be formed on one or both sides of the emitter 387 in the second direction (e.g., in Y direction). This implies that the collector pad 361 may also be formed on one or both sides of the emitter 387 in the second direction. This means that the size reduction in the second direction can be from one or both sides of the emitter 387.

Also as seen in FIG. 8A, note that the resistor 390 may be adjacent in the first direction (e.g, X direction) to the active device 355 of the unit cell 350. At least a portion of the resistor 390 may be in the non-active region 334. In an aspect, the capacitor 357 may be a ballasting capacitor. Alternatively, or in addition thereto, the resistor 390 may be a ballasting resistor.

Thus far, three metal layer semiconductor device have been described. However, similar issues may also exist for two metal layer power amplifiers. Thus, the proposed solution may also apply to two metal layer semiconductor devices.

Figures 9A, 9B:
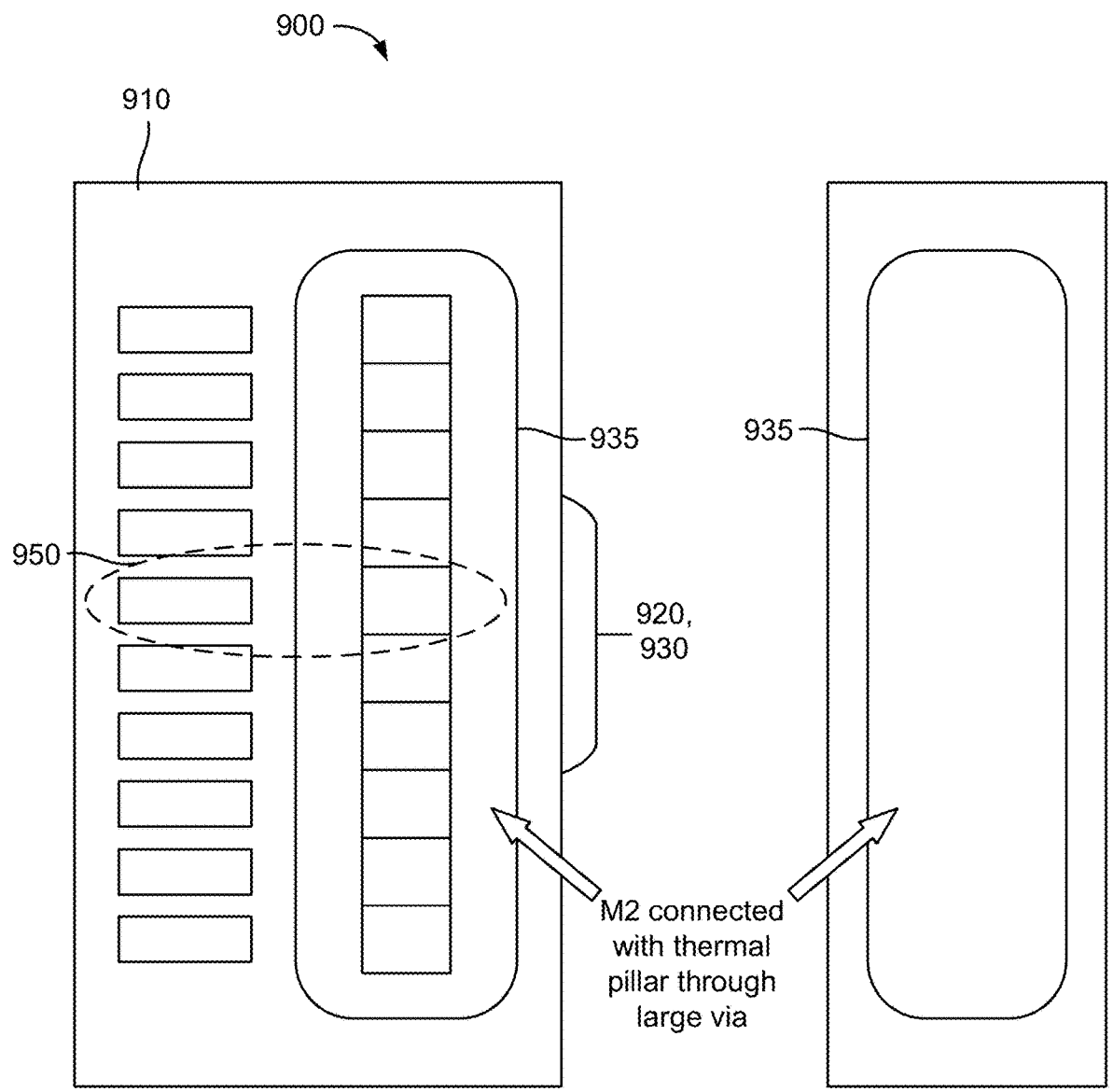
FIGS. 9A, 9B and 10 illustrate an X-Y plane view of another conventional power amplifier.

FIG. 9A illustrates an X-Y plane view of a conventional two metal layer power amplifier (PA) 900. As seen, the conventional PA 900 comprises a plurality of unit cells 950 formed on a substrate 910. The plurality of unit cells 950 comprises a plurality of active devices 955. The PA 900 also comprises first and second metal layers 920, 930 patterned on the substrate 910 and on the plurality of active devices. In the conventional PA 900, a thermal bump 935 is formed with the second metal layer 930. A portion of the second metal layer 930 corresponding to the thermal bump 935 is connected with the thermal pillar 970 through a large via as illustrated in FIG. 9B.

Figure 10:
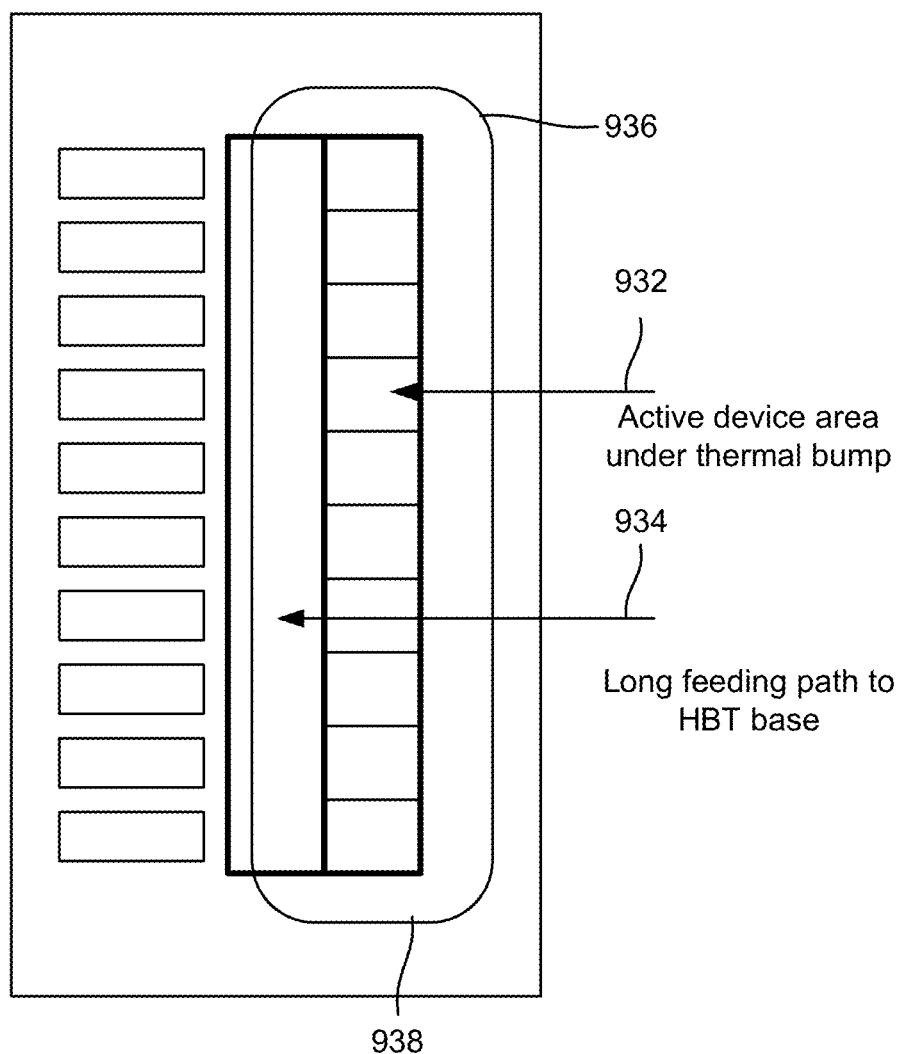

FIG. 10 also illustrates an X-Y plane view of the conventional PA 900. In FIG. 10, the thermal bump 935 is shown to be connected to first and second thermal bump ends 936, 938. A region between the first and second thermal bump ends 936, 938 includes an active region 932 and a non-active region 934. In this instance, the second metal layer 930 covers or overlaps both the active and non-active regions 934. This means that a long feeding path to a base of a heterojunction bipolar transistor (an example of an active device) becomes necessary. This is mostly a wasted space under thermal bump 935.

Figures 11A, 11B:
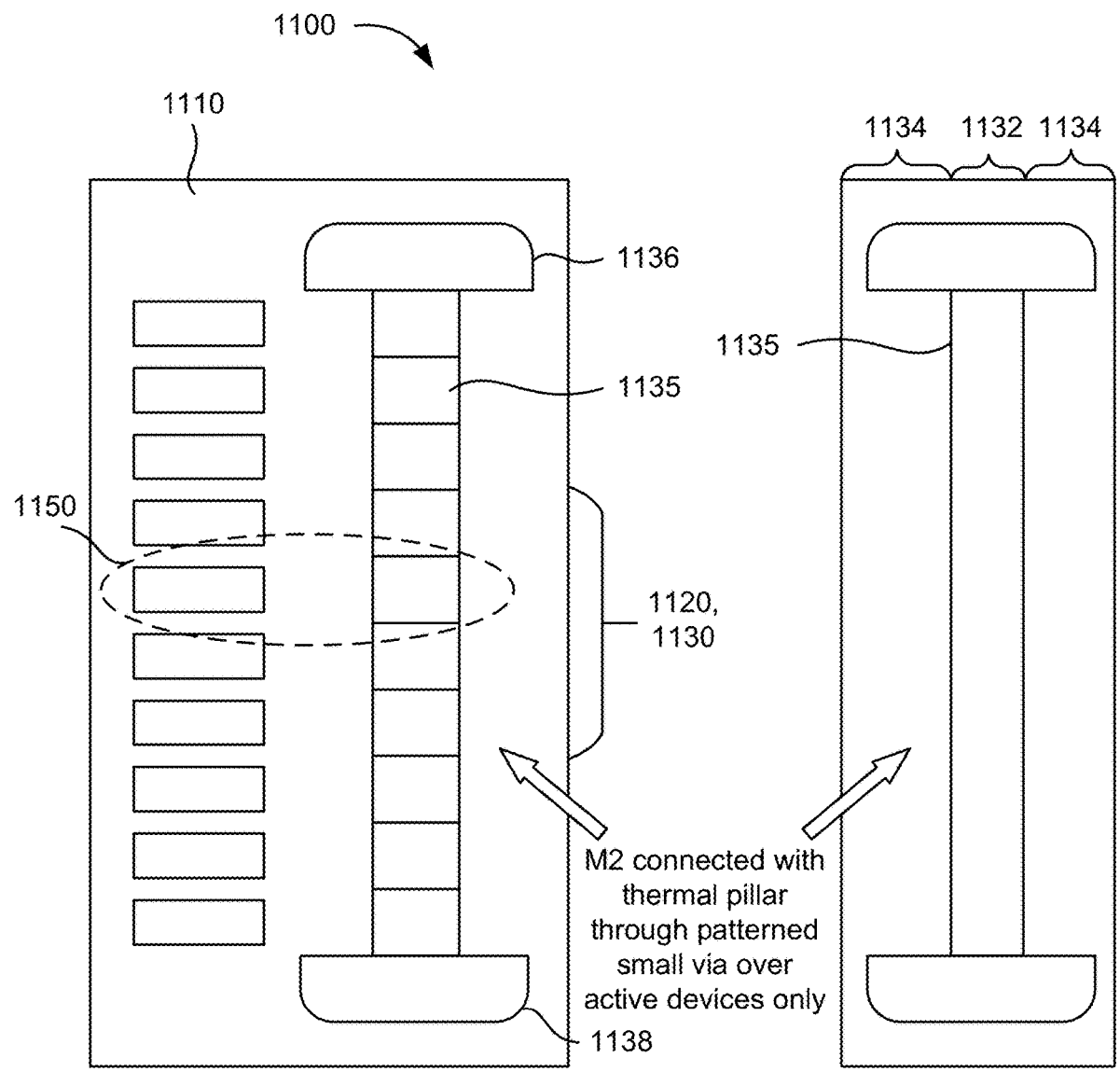
FIGS. 11A and 11B illustrate an X-Y plane view of another example semiconductor device in accordance with one or more aspects of the disclosure.

FIGS. 11A and 11B illustrate an X-Y plane view of a semiconductor device 1100, e.g., a power amplifier, that addresses one or more issues of the conventional PA 900. As seen, the semiconductor device 1100 may comprise a plurality of unit cells 1150 formed on a substrate 1110. The plurality of unit cells 1150 comprises a plurality of active devices 1155. The plurality of active devices 1155 may have a first width in a first direction (e.g., X direction) and may be aligned along a first length in a second direction (e.g., Y direction) (not shown).

The semiconductor device 1100 may also comprise first and second metal layers 1120, 1130 patterned on the substrate 1110 and on the plurality of active devices 1155. The first metal layer 1120 may be patterned to form a plurality of thermal pads 1122 on the plurality of active devices 1155.

The second metal layer 1130 may be patterned to form a thermal bump 1135 on the plurality of thermal pads 1122. Compared with the conventional PA 900, the thermal bump 1135 may be connected to the thermal pillar 1170 through a much smaller via as illustrated in FIG. 11B. The thermal bump 1135 may have a second width in the first direction and a second length in the second direction.

The second metal layer 1130 may also patterned to form first and second thermal bump ends 1136, 1138 with the thermal bump 1135 connected therebetween. The first and second thermal bump ends 1136, 1138 may each have a width greater than the second width. A region between the first and second thermal bump ends 1136, 1138 may be divided into active and non-active regions 1132, 1134. The active region may be viewed as being a portion of the region occupied by the thermal bump 1135, and the non-active region 1134 may be viewed as being a remainder portion of the region. The second width and the second length of the thermal bump 1135 may be oriented such that the active region 1132 overlaps the first width and the first length of the plurality of active devices 1155. The thermal bump 1135 may completely overlap the plurality of active devices 1155. At a minimum, the second width of the thermal bump 1135 may be equal or substantially equal to the first width of the plurality of active devices 1155.

In an aspect, the plurality of active devices 1155 are thermally coupled to the thermal pillar 1170 through the plurality of thermal pads 1122 and the thermal bump 1135. For example, they may be in physical contact with each other. For example, the plurality of thermal pads 1122 may be on and in contact with the plurality of active devices 1155. Alternatively, or in addition thereto, the thermal bump 1135 may be on and in contact with the plurality of thermal pads 1122. Also alternatively or in addition thereto, the thermal pillar 1170 maybe on and in contact with the thermal bump 1135.

Figures 12A, 12B:
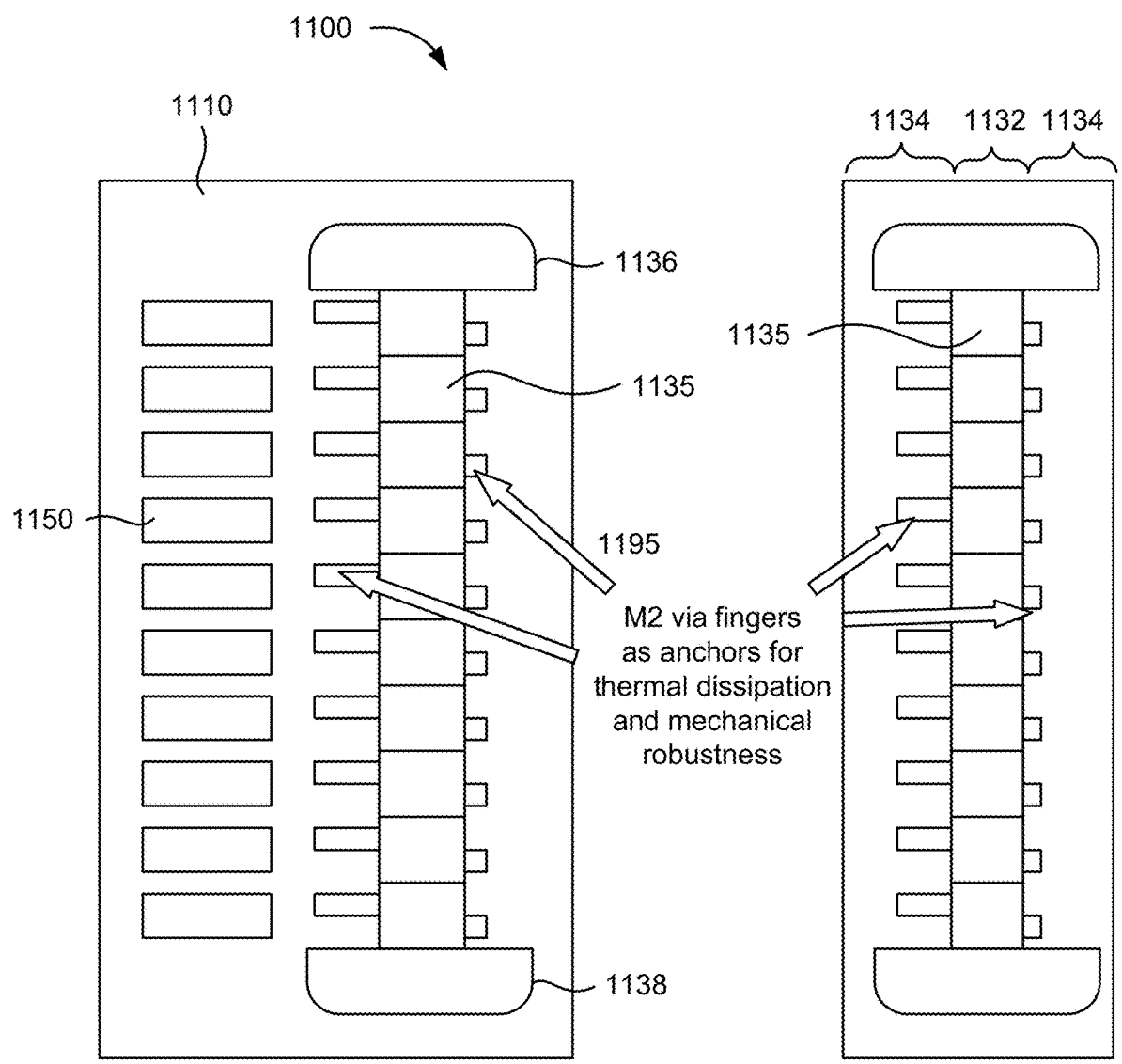
FIGS. 12A and 12B illustrate an X-Y plane view of another example semiconductor device in accordance with one or more aspects of the disclosure.

FIGS. 12A and 12B illustrate an X-Y plane view of another example semiconductor device in accordance with one or more aspects of the disclosure. In this example, the semiconductor device may also comprise one or more thermal fingers 1195 formed from the second metal layer 1130. The one or more thermal fingers 1195 may be connected to and extend from the thermal bump 1135 in the first direction into the non-active region 1134. This can enhance thermal dissipation capabilities and also increase mechanical robustness of the semiconductor device 1100.

Figure 13A:
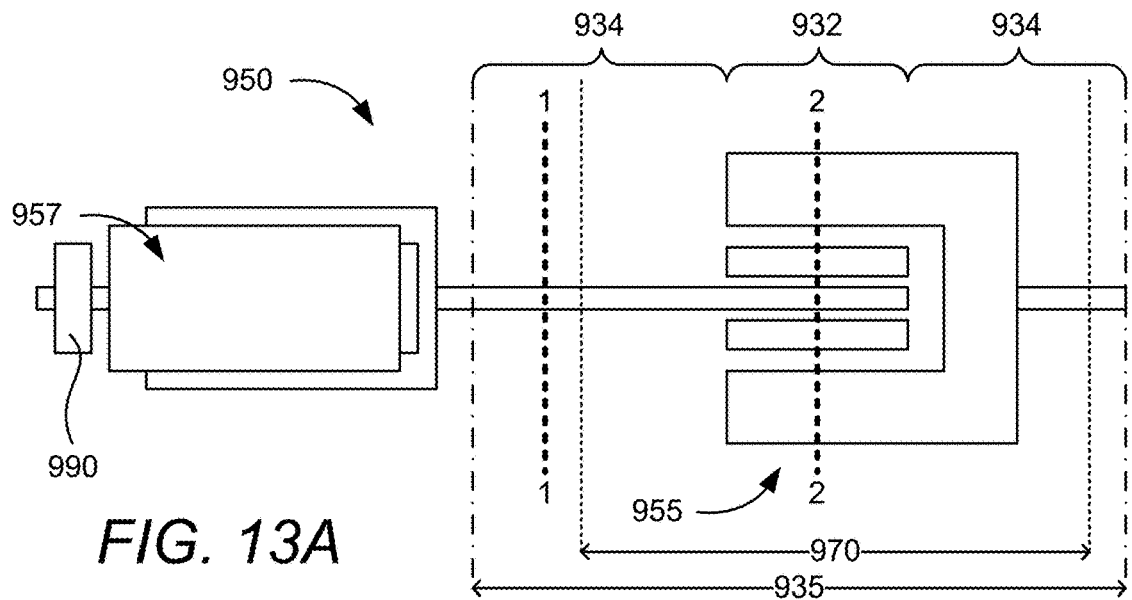
FIGS. 13A, 13B and 13C illustrate an X-Y plane view and cross-sectional views of a conventional unit cell of a conventional power amplifier.
Figure 13B:
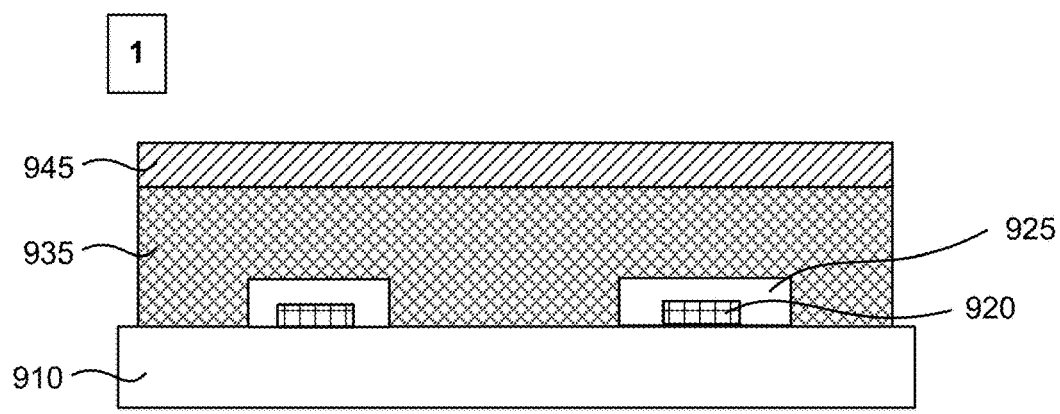
Figure 13C:
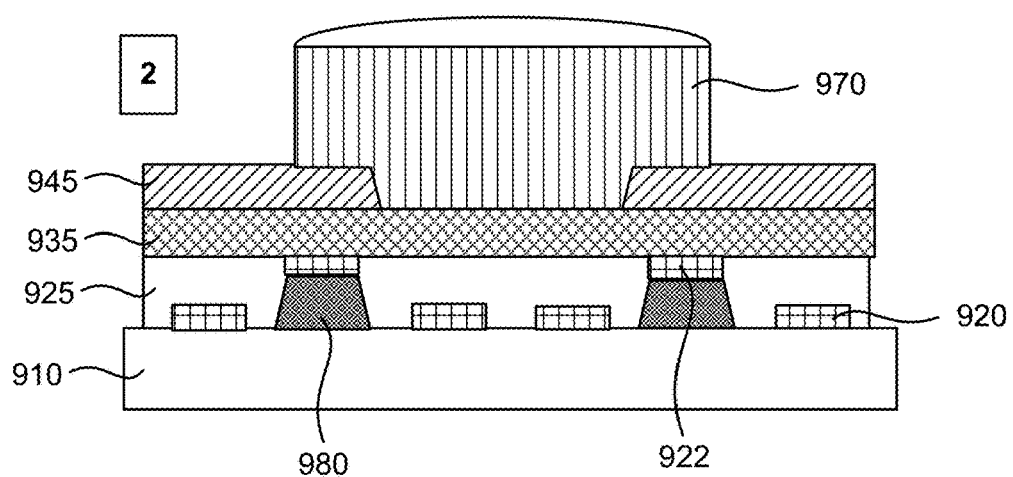

For description of the unit cell in the two metal layer instance, FIGS. 13A, 13B and 13C illustrate an X-Y plane view and cross-sectional views of a conventional unit cell 950 of a conventional power amplifier. As seen in FIG. 13A, the conventional unit cell 950 comprises a resistor 990, an active device 955 and a capacitor 957 adjacent in the X direction from the active device 955. Also shown are the active and non-active regions 932, 934. Further, widths of a thermal pillar 970 and a thermal bump 935 are also illustrated. Note that in the conventional two metal layer unit cell 950, all of the thermal bump 935 and the thermal pillar 970 occupy both active and non-active regions 932, 934.

FIG. 13B illustrates a cross-section of the unit cell 950 along the line "1-1" in the non-active region 934. Note this is also outside the width of the thermal pillar 970. In this cross-section, the conventional unit cell 950 comprises a substrate 910, patterned first metal layer 920, thermal pad 922, dielectric 925, patterned second metal layer forming the conventional thermal bump 935, final passivation 945, and thermal pillar 970.

FIG. 13C illustrates a cross-section of the unit cell 950 along the line "2-2" in the active region 932. In this cross-section, the unit cell 950 comprises the substrate 910, transistor 980, the patterned first metal layer 920, the dielectric 925, the thermal bump 935, the final passivation 945, and the thermal pillar 970.

Figure 14A:
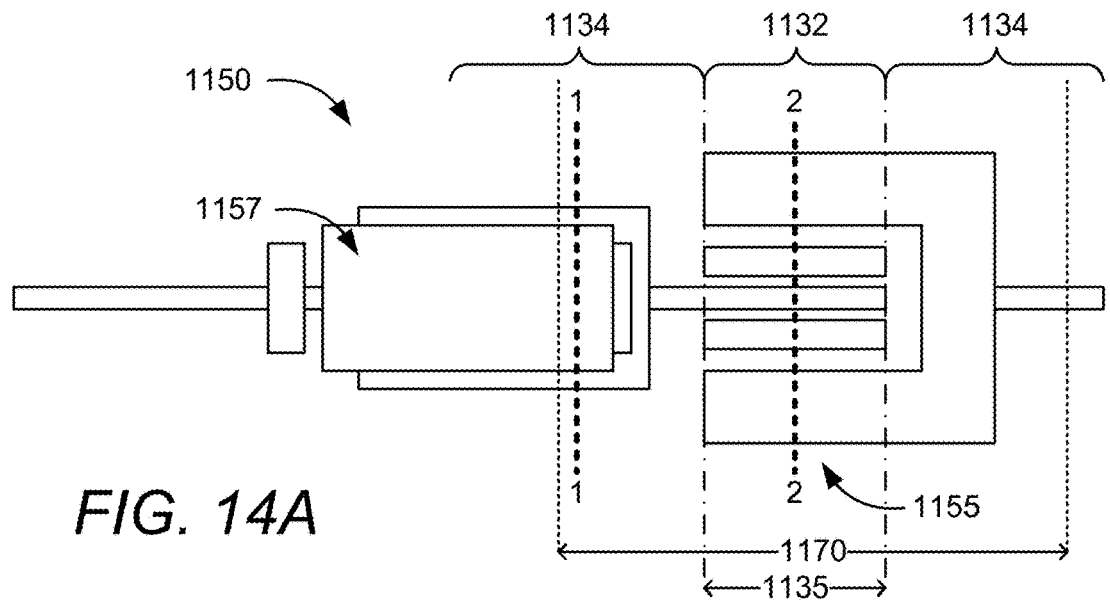
FIGS. 14A, 14B and 14C illustrate an X-Y plane view and cross-sectional views of an example unit cell of a semiconductor device in accordance with one or more aspects of the disclosure.
Figure 14B:
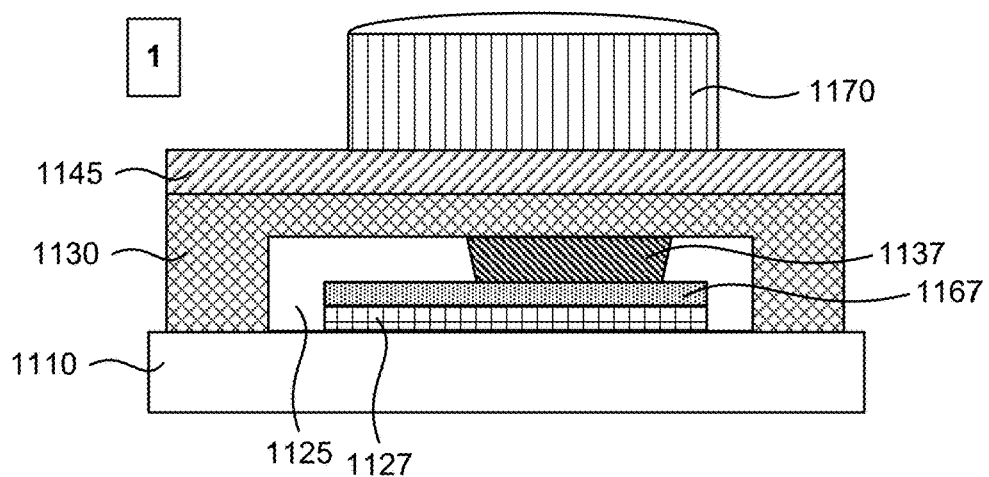
Figure 14C:
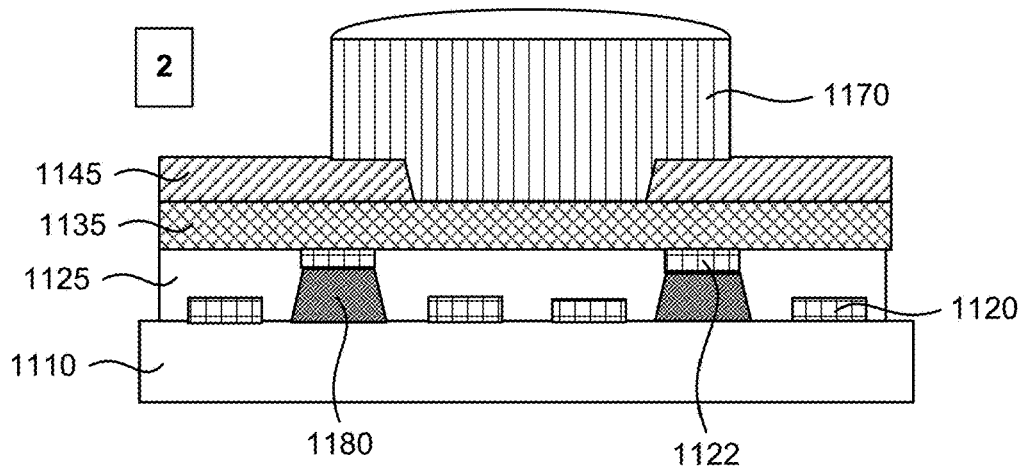

FIGS. 14A, 14B and 14C illustrate an X-Y plane view and cross-sectional views of an example unit cell 1150 of a semiconductor device 1100 (e.g., a power amplifier (PA)) in accordance with one or more aspects of the disclosure. As seen in FIG. 14A, the unit cell 1150 may comprise an active device 1155 and a capacitor 1157 adjacent in the first direction (e.g., X direction) from the active device 1155. Also shown are the active and non-active regions 1132, 1134 and the widths of the thermal pillar 1170, and the thermal bump 1135. In this instance, at least a portion of the of the capacitor 1157 may be in the non-active region 1134, i.e., much closer to the active device 1155. This is enabled since the second metal layer 1130 is not within the non-active region 1134.

FIG. 14B illustrates a cross-section of the unit cell 1150 along the line "1-1" in the non-active region 1134. In this cross-section, the unit cell 1150 may include the capacitor 1157, which may comprise a lower plate 1127, an upper plate 1137, and a capacitor dielectric 1167 between the lower and upper plates 1127, 1137. The first metal layer 1120 may be patterned to form the lower plate 1127. The second metal layer 1130 or some other metal layer may be patterned to form the upper plate 1137. That is, the upper plate 1137 may be electrically coupled to or patterned from the second metal layer 1130.

FIG. 14C illustrates a cross-section of the unit cell 1150 along the line "2-2" in the active region 1132. In this cross-section, the unit cell 1150 may comprise the substrate 1110, transistor 1180, the patterned first metal layer 1120 on the substrate 1110, thermal pad 1122 (e.g., formed from first metal layer 1120) on the transistor 1180, the dielectric 1125, the thermal bump 1135, the final passivation 1145, and the thermal pillar 1170.

The unit cell of FIGS. 14A-14C may be viewed as two metal layer version of the three metal layer unit cell of FIGS. 7A-7D. Thus, similar size reduction benefits may be achieved.

Figure 15A:
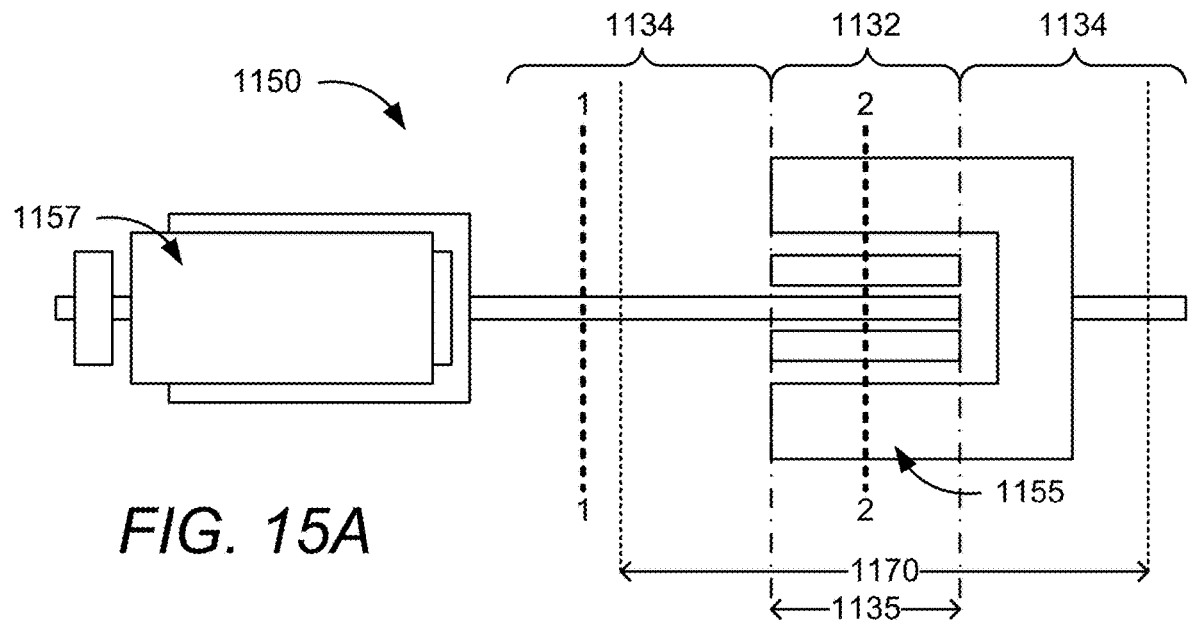
FIGS. 15A and 15B illustrate X-Y plane views of other example unit cells of a semiconductor device in accordance with one or more aspects of the disclosure.
Figure 15B:
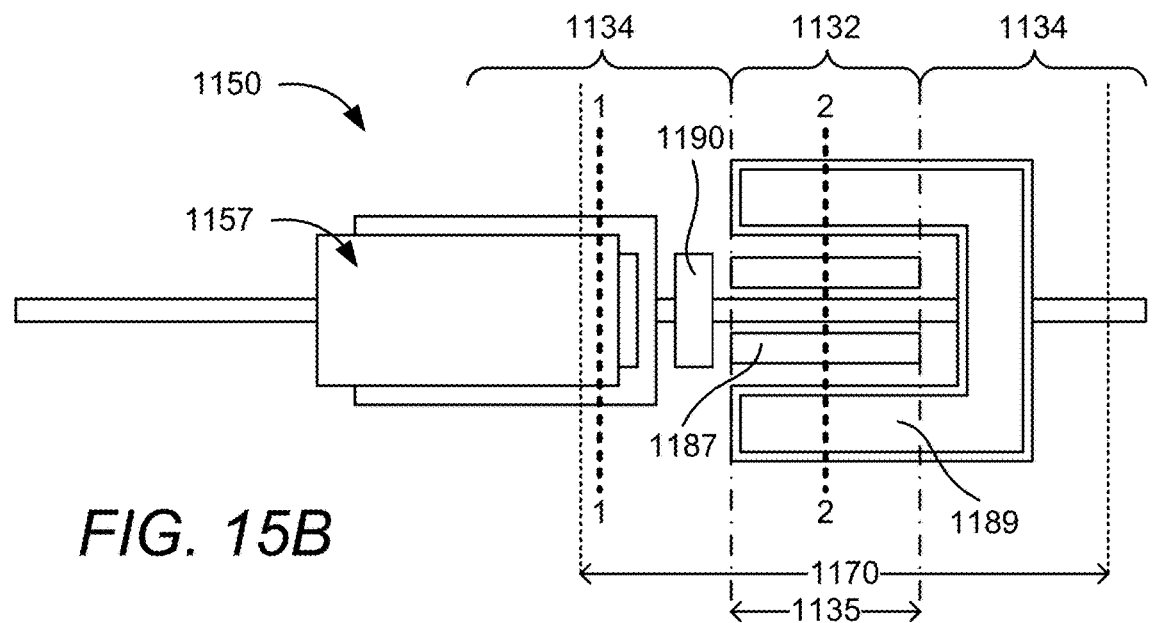

Plane views of some other example unit cells are illustrated in FIGS. 15A and 15B. The unit cell 1150 of FIG. 15A may be a two metal layer version of the three metal layer unit cell illustrated in FIGS. 6A-6C. Note that unlike the conventional two metal layer unit cell of FIGS. 13A-13C, the thermal bump 1135 of the unit cell of FIG. 15A only over the active devices. It should be relatively straight forward to arrive at the unit cell 1150 of FIG. 15A.

The unit cell of FIG. 15B, which includes a transistor comprising an emitter 1187 and a collector 1189, may be a two metal layer version of the three metal layer unit cell illustrated in FIGS. 8A-8D. That is, at least a portion of the capacitor 1157 may be in the non-active region 1134. As a result, size reduction in the first direction may be achieved. Alternatively, or in addition thereto, one or more resistors 1190 may be within the non-active region 1134 as well. Further alternatively or in addition thereto, current capacity of the active device (e.g., HBT) may be enhanced through electrically coupling the collector 1189 with collector pad formed from first and second metal layers. Again, it should be relatively straight forward to arrive at the unit cell of FIG. 15B.

FIGS. 16A-16J illustrate example stages of fabricating a three metal layer unit cell of a semiconductor device. Each of these figures may be a view along any one or more of the lines "0-0", "1-1", or "2-2" of FIGS. 6A, 7A, 8A.

Figure 16A:
FIGS. 16A-16J illustrate examples of stages of fabricating unit cells of a semiconductor device in accordance with one or more aspects of the disclosure.

FIG. 16A illustrates a stage in which transistor 380 (or active device 355 more generally) may be fabricated on substrate 310.

Figure 16B:
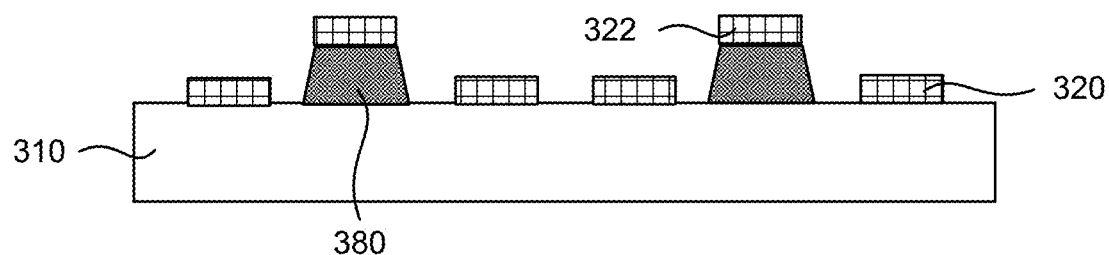

FIG. 16B illustrates a stage in which first metal layer 320 may be deposited and patterned to form various components. For example, thermal pads 322 may be formed on the transistor 380. The first metal layer 320 may be gold (Au), Au alloy, copper (Cu), aluminum (Al), etc., or any combination thereof. The first metal layer 320 may be formed by evaporation, plating, etch process, lift-off process, etc.

Figure 16C:
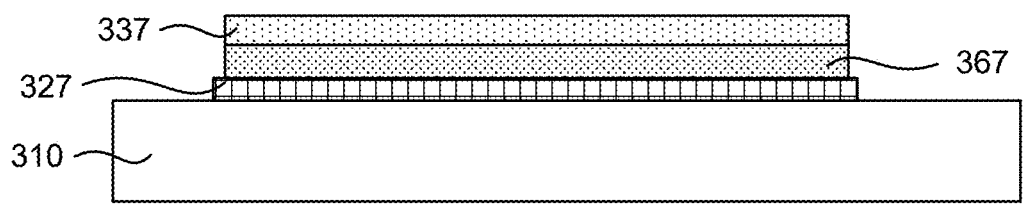

FIG. 16C illustrates a stage in which dielectric layer may be deposited and patterned to form the capacitor dielectric 367, and a capacitor metal may be deposited and patterned to form the upper plate 337. The capacitor dielectric may be formed from silicon oxide (SiO2), silicon nitride (SiN), silicon oxynitride (SiON), aluminum oxide ($Al_2O_3$), etc., or any combination thereof. The capacitor dielectric may be formed by spin-coating, plasma-enhanced chemical vapor deposition (PECVD), sputtering, atomic layer deposition (ALD), etc. The capacitor metal may be Au, Au alloy, Cu, Al, etc., or any combination thereof. The first metal layer 320 may be formed by evaporation, plating, etch process, lift-off process, etc. In one aspect, the capacitor metal may be the second metal layer 330. In another aspect, the capacitor metal may be metal separate from the second metal layer 330.

Figure 16D:
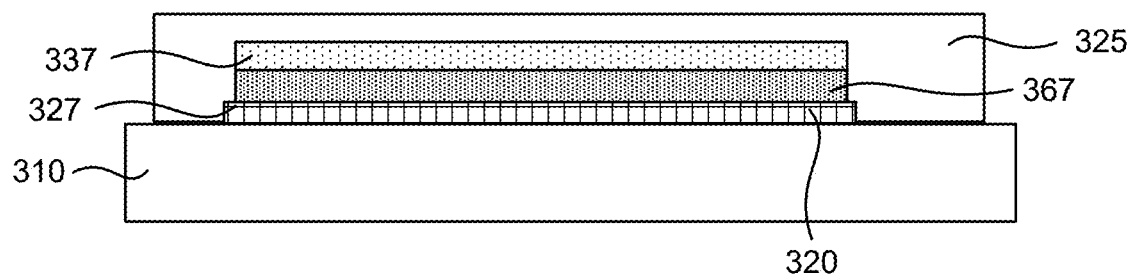
Figure 16E:
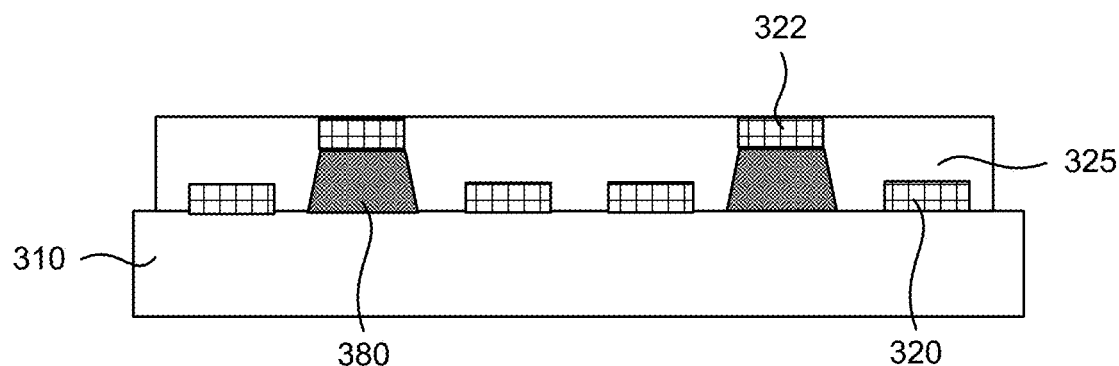

FIGS. 16D and 16E illustrate a stage in which a dielectric layer may be deposited and patterned to form the dielectric 325. The dielectric layer may be SiO2, SiN, SiON, benzocyclobutene (BCB), polyimide, or any combination thereof. A thick layer may be preferable for better parasitic capacitance reduction. The dielectric layer may be formed by spin-coating, plasma-enhanced chemical vapor deposition (PECVD), sputtering, atomic layer deposition (ALD), etc.

Figure 16F:
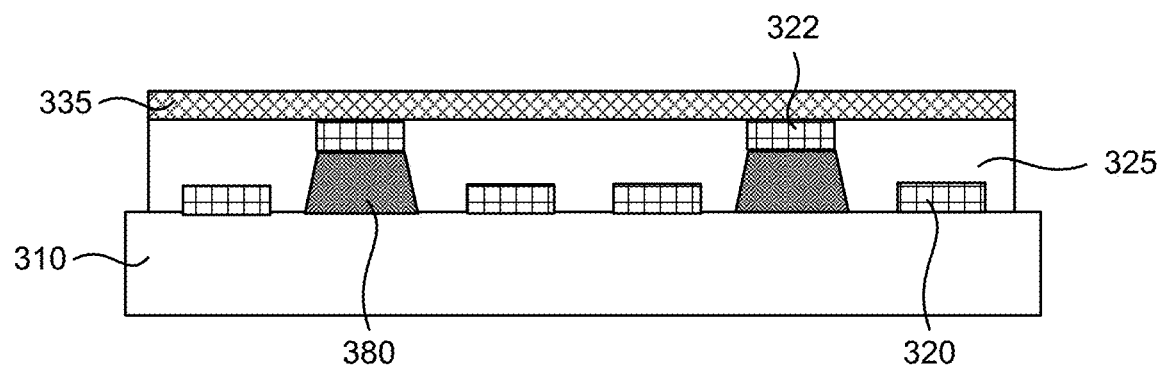

FIG. 16F illustrates a stage in which the second metal layer 330 may be deposited and patterned to form the thermal bump 335. The second metal layer 330 may be Au, Au alloy, Cu, Al, etc., or any combination thereof. The second metal layer 330 may be formed by evaporation, plating, etch process, lift-off process, etc.

Figure 16G:
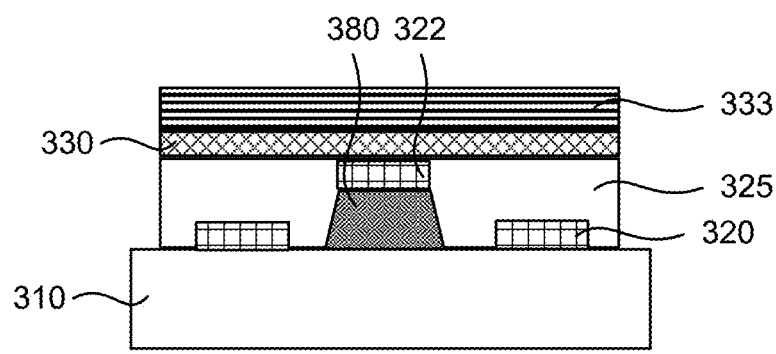

FIG. 16G illustrates a stage in which a dielectric layer may be deposited and patterned to form the dielectric 333 in between second and third metal layers 330, 340, e.g., in between the thermal bump 335 and the thermal bar 342. The dielectric layer may be SiO2, SiN, SiON, BCB, polyimide, or any combination thereof. A thick layer may be preferable for better parasitic capacitance reduction. The dielectric layer may be formed by spin-coating, PECVD, sputtering, ALD, etc.

Figure 16H:
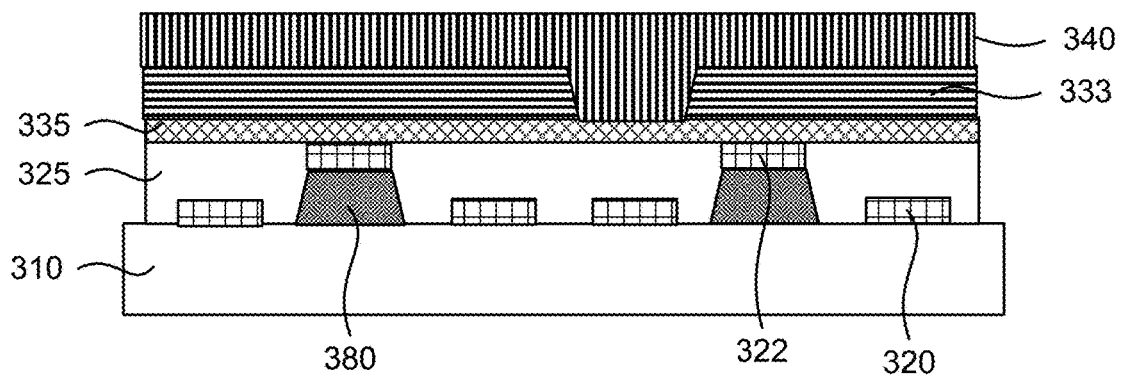

FIG. 16H illustrates a stage in which the third metal layer 340 may be deposited and patterned to form various components. For example, the thermal bar 342 may be formed. The third metal layer 340 may be Au, Au alloy, Cu, Al, etc., or any combination thereof. The third metal layer 340 may be formed by evaporation, plating, etch process, lift-off process, etc.

Figure 16I:
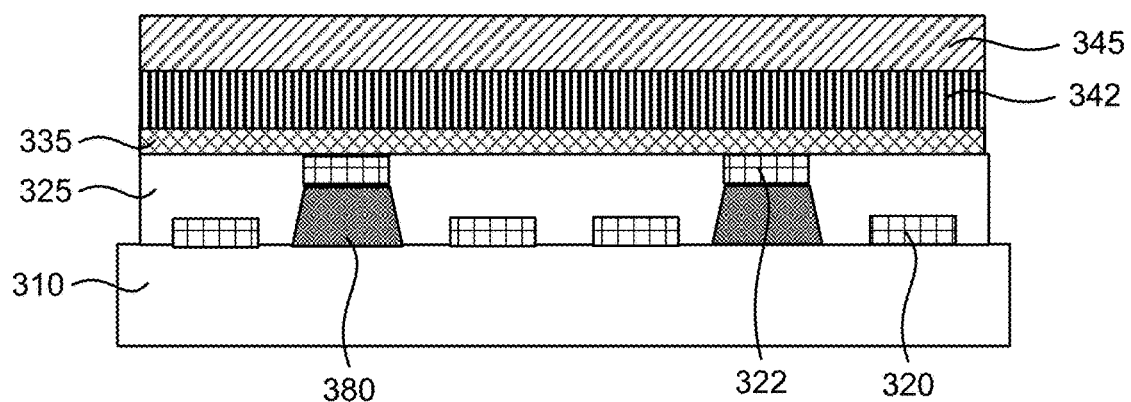

FIG. 16I illustrates a stage in which a dielectric layer may be deposited and patterned to form the final passivation 345. The final dielectric layer may be SiO2, SiN, SiON, BCB, polyimide, or any combination thereof. A thick layer may be preferable for better parasitic capacitance reduction. The final dielectric layer may be formed by spin-coating, PECVD, sputtering, ALD, etc.

Figure 16J:
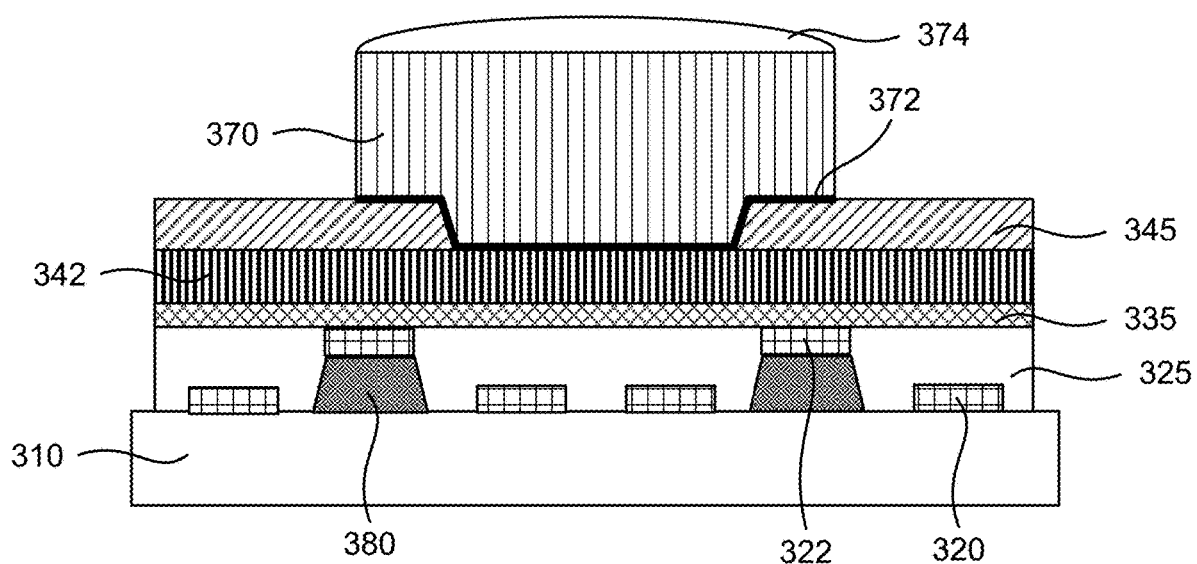

FIG. 16J illustrates a stage in which the thermal pillar 370 may be formed. For example, a thick Cu layer may be electroplated to form the thermal pillar 170. A seed layer 372 may be formed before forming the thermal pillar 370, and a cap layer may be plated on the thermal pillar 370 to form a cap 374. A high temperature reflow may follow the cap layer plating.

FIGS. 17A-17J illustrate example stages of fabricating a three metal layer unit cell of a semiconductor device. Each of these figures may be a view along any one or more of the lines "0-0", "1-1", or "2-2" of FIGS. 14A, 15A, 15B.

Figure 17A:
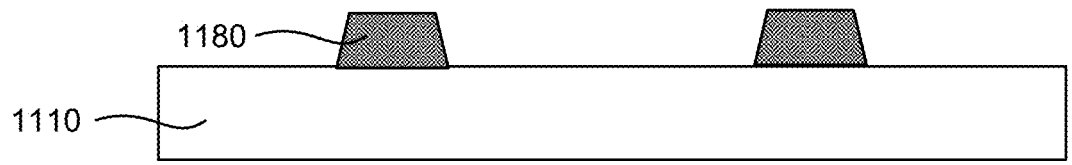
FIGS. 17A-17I illustrate other examples of stages of fabricating unit cells of a semiconductor device in accordance with one or more aspects of the disclosure.

FIG. 17A illustrates a stage in which transistor 1180 (or active device 1155 more generally) may be fabricated on substrate 1110.

Figure 17B:
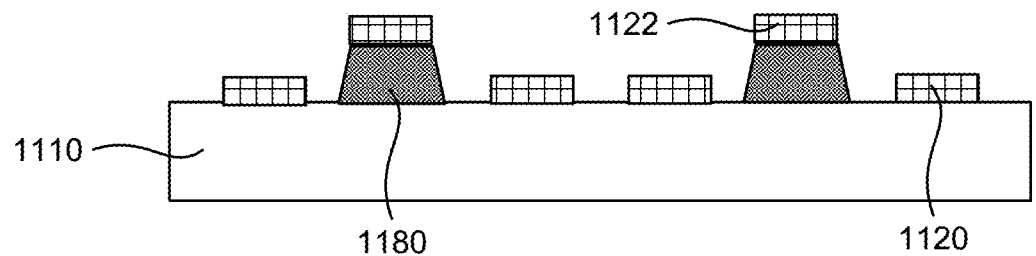

FIG. 17B illustrates a stage in which first metal layer 1120 may be deposited and patterned to form various components. For example, thermal pads 1122 may be formed on the transistor 1180. The first metal layer 1120 may be Au, Au alloy, Cu, Al, etc., or any combination thereof. The first metal layer 1120 may be formed by evaporation, plating, etch process, lift-off process, etc.

Figure 17C:
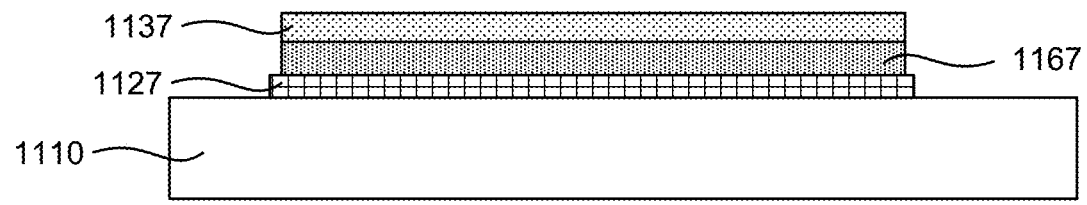

FIG. 17C illustrates a stage in which dielectric layer may be deposited and patterned to form the capacitor dielectric 1167, and a capacitor metal may be deposited and patterned to form the upper plate 1137. The capacitor dielectric may be formed from SiO2, SiN, SiON, $Al_2O_3$, etc., or any combination thereof. The capacitor dielectric may be formed by spin-coating, PECVD, sputtering, ALD, etc. The capacitor metal may be Au, Au alloy, Cu, Al, etc., or any combination thereof. The first metal layer 1120 may be formed by evaporation, plating, etch process, lift-off process, etc. In one aspect, the capacitor metal may be the second metal layer 1130. In another aspect, the capacitor metal may be metal separate from the second metal layer 1130.

Figure 17D:
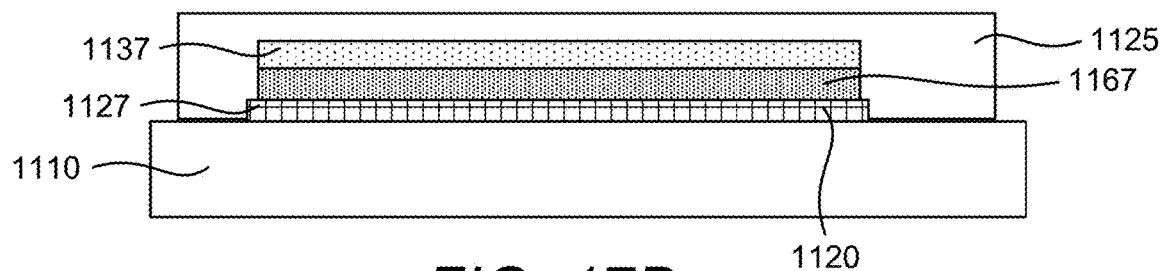
Figure 17E:
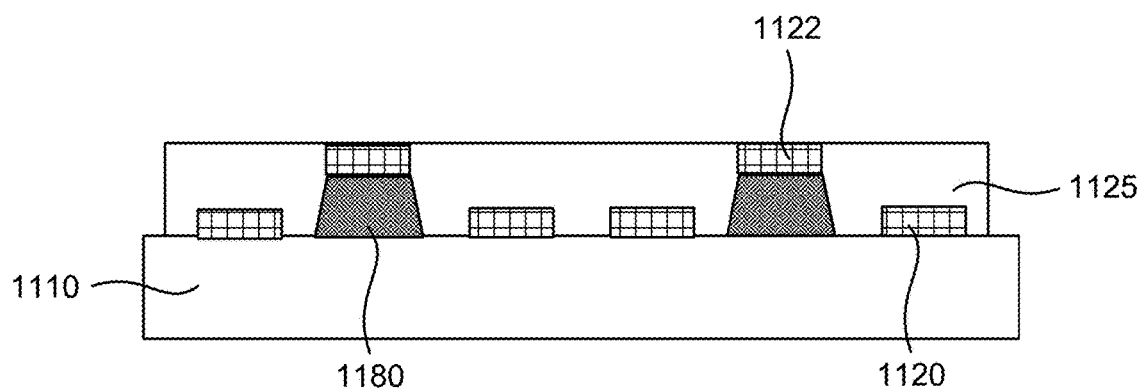

FIGS. 17D and 17E illustrate a stage in which a dielectric layer may be deposited and patterned to form the dielectric 1125. The dielectric layer may be SiO2, SiN, SiON, BCB, polyimide, or any combination thereof. A thick layer may be preferable for better parasitic capacitance reduction. The dielectric layer may be formed by spin-coating, PECVD, sputtering, ALD, etc.

Figure 17F:
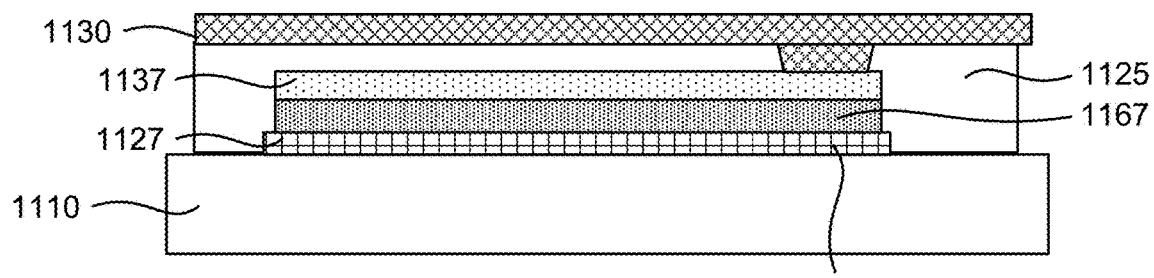
Figure 17G:
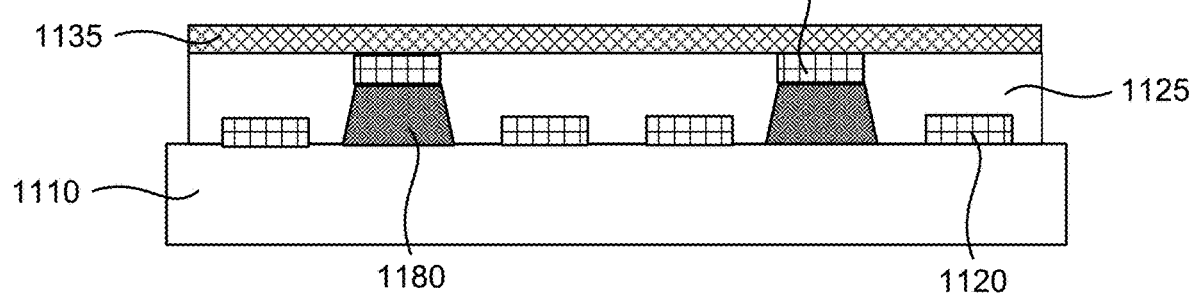

FIGS. 17F and 17G illustrate a stage in which the second metal layer 1130 may be deposited and patterned to form various components. For example, the thermal bump 1135 may be formed. The second metal layer 1130 may be Au, Au alloy, Cu, Al, etc., or any combination thereof. The second metal layer 1130 may be formed by evaporation, plating, etch process, lift-off process, etc. In an aspect, the second metal layer 1130 may be combined with a cap metal.

Figure 17H:
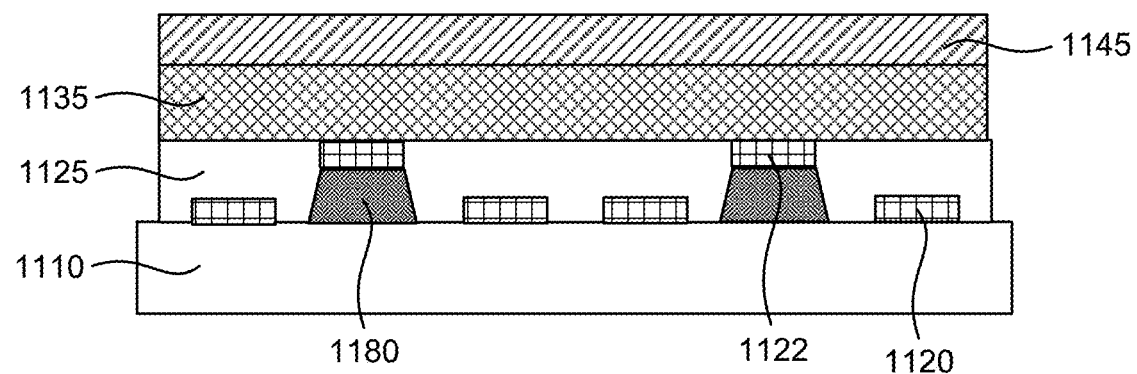

FIG. 17H illustrates a stage in which a dielectric layer may be deposited and patterned to form the final passivation 1145. The final dielectric layer may be SiO2, SiN, SiON, BCB, polyimide, or any combination thereof. A thick layer may be preferable for better parasitic capacitance reduction. The final dielectric layer may be formed by spin-coating, PECVD, sputtering, ALD, etc.

Figure 17I:
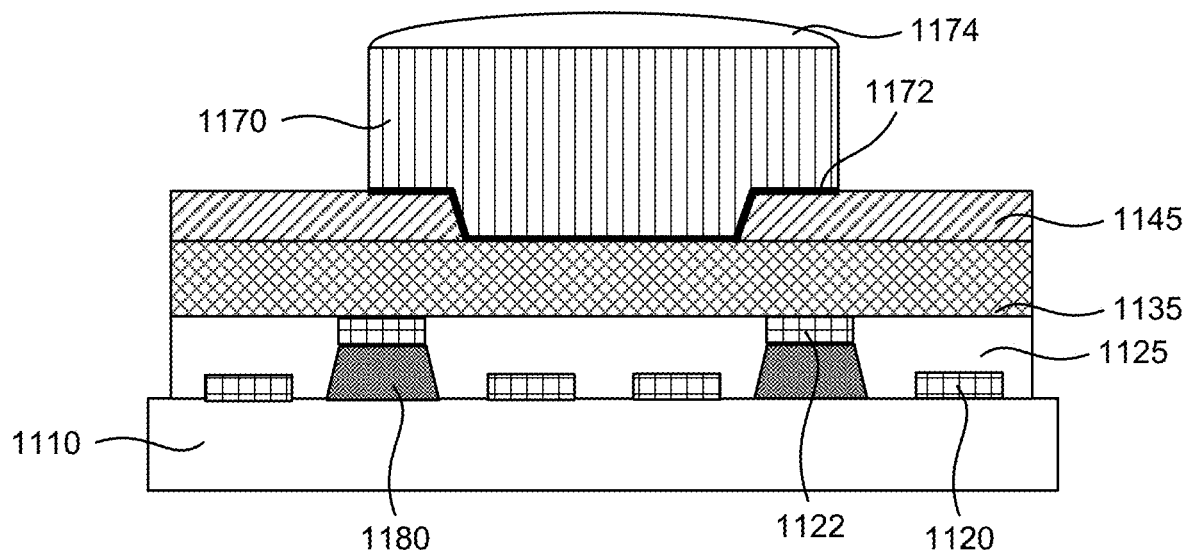

FIG. 17I illustrates a stage in which the thermal pillar 1170 may be formed. For example, a thick Cu layer may be electroplated to form the thermal pillar 170. A seed layer 1172 may be formed before forming the thermal pillar 1170, and a cap layer may be plated on the thermal pillar 1170 to form a cap 1174. A high temperature reflow may follow the cap layer plating.

Figure 18:
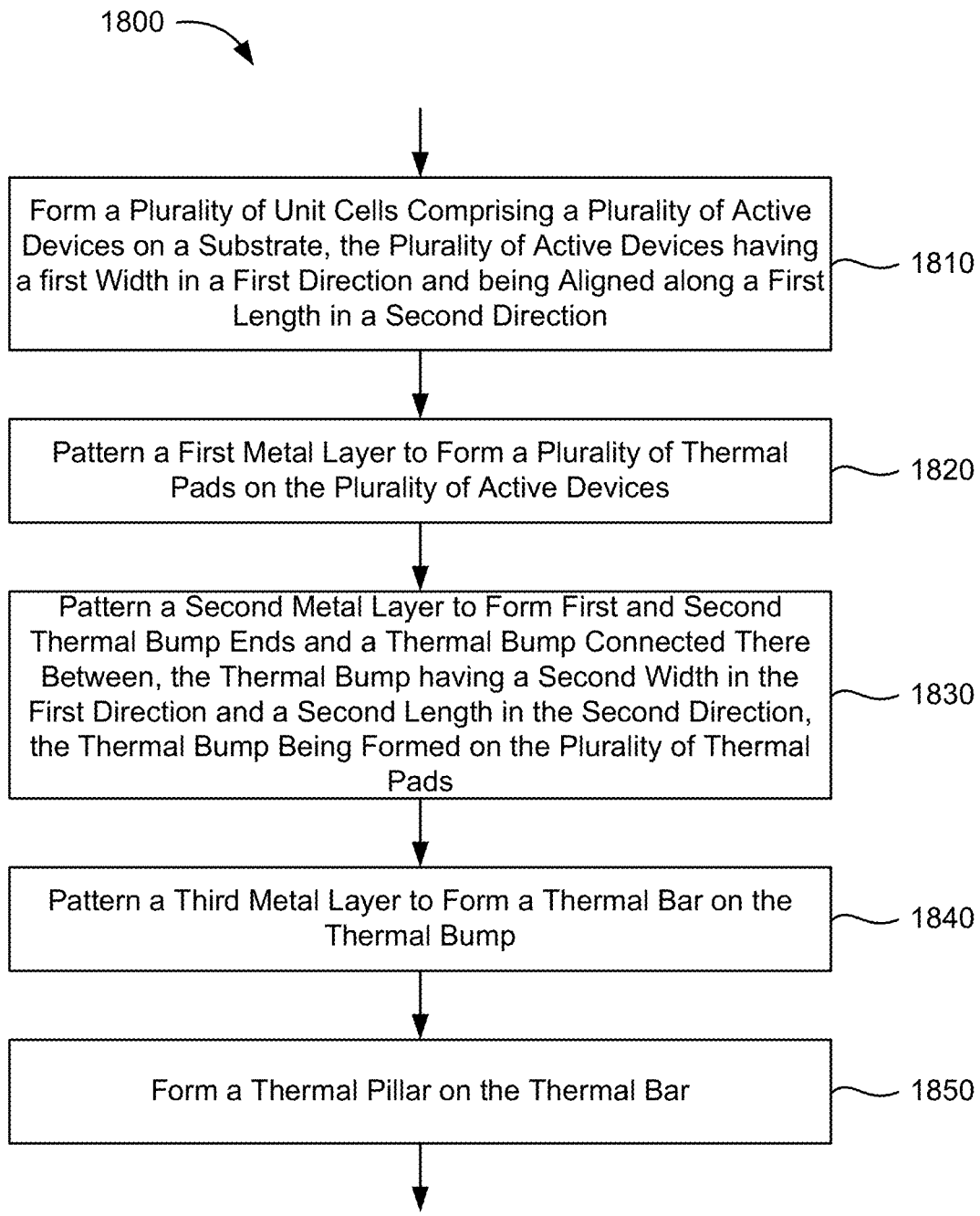
FIG. 18 illustrates a flow chart of an example method of manufacturing unit cells of a semiconductor device in accordance with one or more aspects of the disclosure.

FIG. 18 illustrates a flow chart of an example method 1800 of fabricating a semiconductor device such as a three metal layer power amplifier. Blocks of method 1800 correspond to stages of FIGS. 16A-16J.

In block 1810, a plurality of unit cells may be formed. The plurality of unit cells may comprise a plurality of active devices on a substrate. The plurality of active devices may have a first width in a first direction and being aligned along a first length in a second direction.

In block 1820, a first metal layer may be patterned to form a plurality of thermal pads on the plurality of active devices.

In block 1830, a second metal layer may be patterned to form first and second thermal bump ends and a thermal bump connected therebetween. The thermal bump may have a second width in the first direction and a second length in the second direction. The thermal bump may be formed on the plurality of thermal pads.

In block 1840, a third metal layer may be patterned to form a thermal bar on the thermal bump.

In block 1850, a thermal pillar may be formed on the thermal bar. The plurality of active devices may be thermally coupled to the thermal pillar through the plurality of thermal pads, the thermal bump, and the thermal bar. The first and second thermal bump ends each may have a width greater than the second width. A region between the first and second thermal bump ends may be divided into active and non-active regions. The active region may be a portion of the region occupied by the thermal bump, and the non-active region may be a remainder portion of the region. The second width and the second length of the thermal bump may be oriented such that the active region overlaps the first width and the first length of the plurality of active devices.

Figure 19:
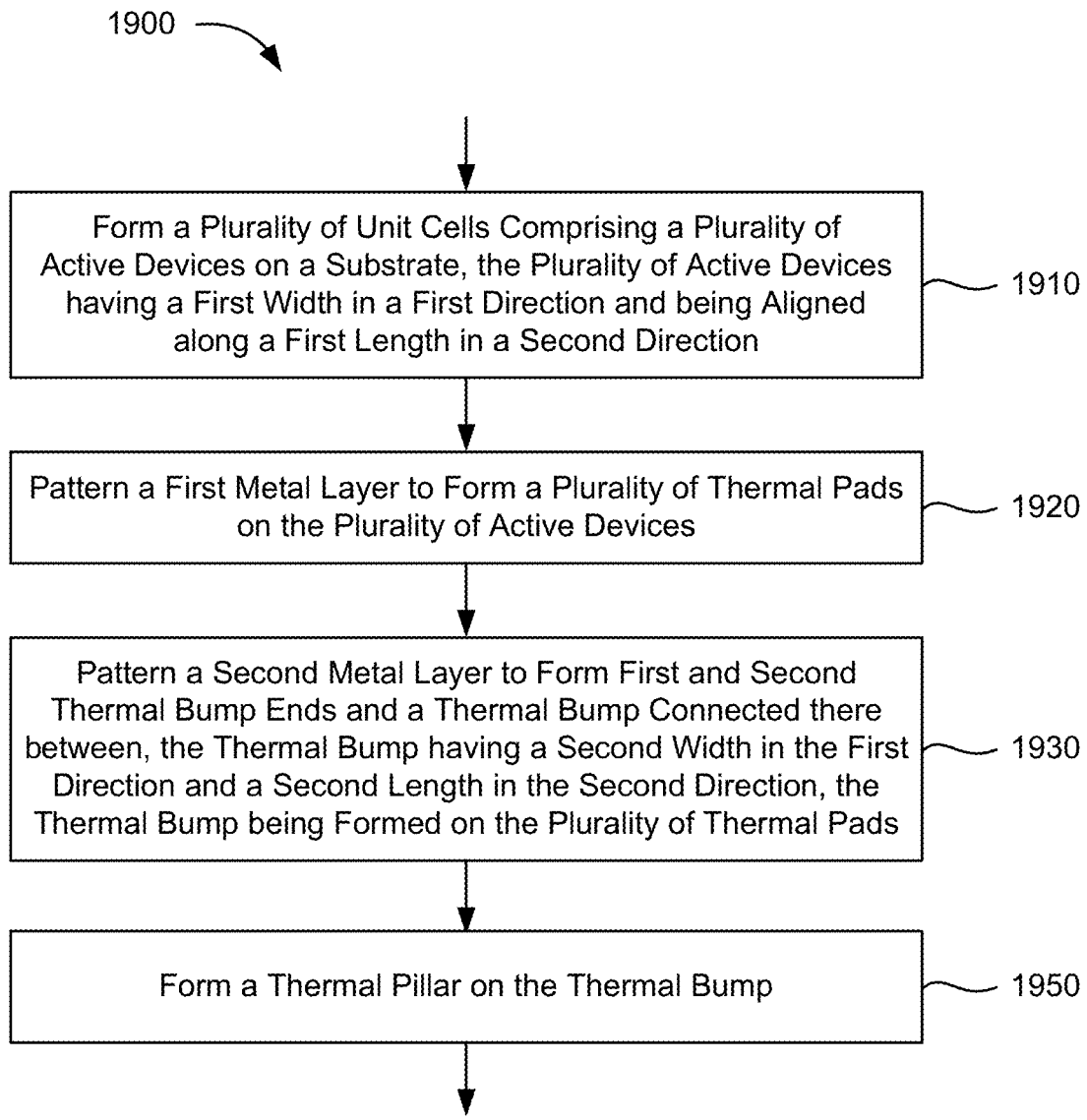
FIG. 19 illustrates a flow chart of another example method of manufacturing unit cells of a semiconductor device in accordance with one or more aspects of the disclosure.

FIG. 19 illustrates a flow chart of an example method 1900 of fabricating a semiconductor device such as a two metal layer power amplifier.

In block 1910, a plurality of unit cells may be formed. The plurality of unit cells may comprise a plurality of active devices on a substrate. The plurality of active devices may have a first width in a first direction and being aligned along a first length in a second direction.

In block 1920, a first metal layer may be patterned to form a plurality of thermal pads on the plurality of active devices.

In block 1930, a second metal layer may be patterned to form first and second thermal bump ends and a thermal bump connected therebetween. The thermal bump may have a second width in the first direction and a second length in the second direction. The thermal bump may be formed on the plurality of thermal pads.

In block 1950, a thermal pillar may be formed on the thermal bump. The plurality of active devices may be thermally coupled to the thermal pillar through the plurality of thermal pads, the thermal bump, and the thermal bar. The first and second thermal bump ends each may have a width greater than the second width. A region between the first and second thermal bump ends may be divided into active and non-active regions. The active region may be a portion of the region occupied by the thermal bump, and the non-active region may be a remainder portion of the region. The second width and the second length of the thermal bump may be oriented such that the active region overlaps the first width and the first length of the plurality of active devices.

It will be appreciated that the foregoing fabrication processes and related discussion were provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations. Further, it will be appreciated that the illustrated configurations and descriptions are provided merely to aid in the explanation of the various aspects disclosed herein. For example, the number and location of the MIM capacitors and/or inductors, the metallization structure may have more or less conductive and insulating layers, the cavity orientation, size, whether it is formed of multiple cavities, is closed or open, and other aspects may have variations driven by specific application design features, such as the number of antennas, antenna type, frequency range, power, etc. Accordingly, the forgoing illustrative examples and associated figures should not be construed to limit the various aspects disclosed and claimed herein.

Figure 20:
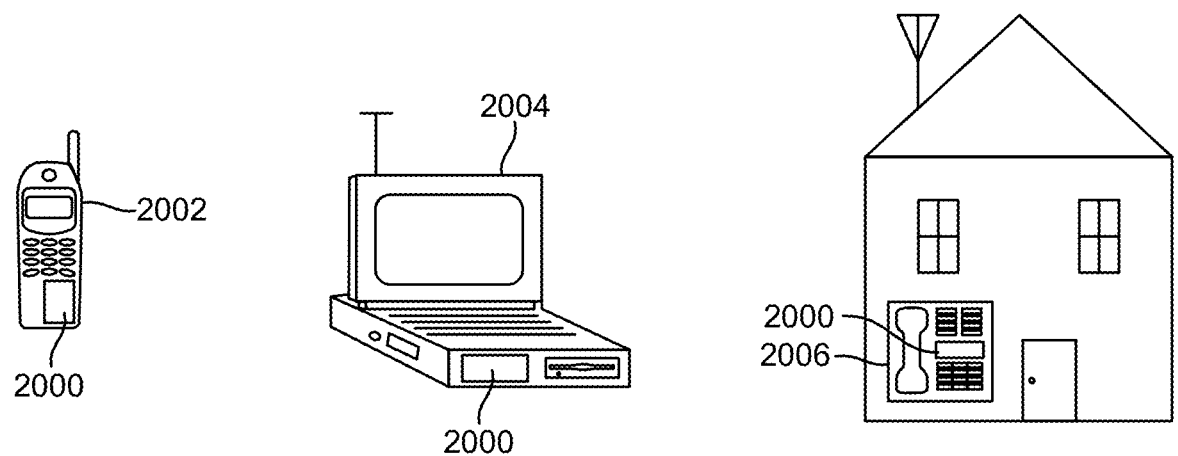
FIG. 20 illustrates various electronic devices which may utilize one or more aspects of the disclosure.

FIG. 20 illustrates various electronic devices 2000 that may be integrated with any of the aforementioned semiconductor device in accordance with various aspects of the disclosure. For example, a mobile phone device 2002, a laptop computer device 2004, and a fixed location terminal device 2006 may each be considered generally user equipment (UE) and may include the semiconductor device as described herein. The devices 2002, 2004, 2006 illustrated in FIG. 20 are merely exemplary. Other electronic devices may also include the RF filter including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A semiconductor device, comprising: a plurality of unit cells comprising a plurality of active devices on a substrate, the plurality of active devices having a first width in a first direction and being aligned along a first length in a second direction; a first metal layer patterned to form a plurality of thermal pads on the plurality of active devices; a second metal layer patterned to form first and second thermal bump ends and a thermal bump connected therebetween, the thermal bump having a second width in the first direction and a second length in the second direction, the thermal bump being formed on the plurality of thermal pads; a third metal layer patterned to form a thermal bar on the thermal bump; and a thermal pillar formed on the thermal bar, wherein the plurality of active devices are thermally coupled to the thermal pillar through the plurality of thermal pads, the thermal bump, and the thermal bar, wherein the first and second thermal bump ends each has a width greater than the second width, a region between the first and second bump ends being divided into active and non-active regions, the active region being a portion of the region occupied by the thermal bump, and the non-active region being a remainder portion of the region, and wherein the second width and the second length of the thermal bump is oriented such that the active region overlaps the first width and the first length of the plurality of active devices.

Clause 2: The semiconductor device of Clause 1, wherein the thermal bump completely overlaps the plurality of active devices.

Clause 3: The semiconductor device of Clause 2, wherein the second width of the thermal bump is substantially equal to the first width of the plurality of active devices.

Clause 4: The semiconductor device of any of Clauses 1-3, wherein an active device of at least one unit cell is a bipolar transistor.

Clause 5: The semiconductor device of Clause 4, wherein the bipolar transistor is a heterojunction bipolar transistor (HBT).

Clause 6: The semiconductor device of any of Clauses 4-5, wherein an emitter of the bipolar transistor is thermally coupled to the thermal bump through a thermal pad corresponding to the active device, and wherein a collector of the bipolar transistor is not electrically coupled to the thermal bump.

Clause 7: The semiconductor device of Clause 6, further comprising: a collector pad on and electrically coupled with the collector, the collector pad comprising: a first collector pad on the collector; and a second collector pad on the first collector pad, wherein the first collector pad is formed from the patterned first metal layer and the second collector pad is formed from the patterned second metal layer.

Clause 8: The semiconductor device of Clause 7, wherein the collector pad is formed on one or both sides of the emitter in the second direction.

Clause 9: The semiconductor device of any of Clauses 1-8, wherein at least one unit cell further comprises a capacitor on the substrate adjacent in the first direction to an active device of the at least one unit cell, and wherein at least a portion of the capacitor is in the non-active region.

Clause 10: The semiconductor device of Clause 9, wherein the capacitor comprises a lower plate, an upper plate, and a capacitor dielectric between the lower and upper plates, the lower plate being patterned from the first metal layer and the upper plate being electrically coupled the patterned third metal layer.

Clause 11: The semiconductor device of any of Clauses 1-10, wherein at least one unit cell further comprises a resistor on the substrate adjacent in the first direction to an active device of the at least one unit cell, and wherein at least a portion of the resistor is in the non-active region.

Clause 12: The semiconductor device of any of Clauses 1-11, further comprising: one or more thermal fingers formed from the second metal layer, the one or more thermal fingers connected to and extending from the thermal bump in the first direction into the non-active region.

Clause 13: The semiconductor device of any of Clauses 1-12, wherein the plurality of thermal pads are on and in contact with the plurality of active devices, the thermal bump is on and in contact with the plurality of thermal pads, the thermal bar is on and in contact with the thermal bump, and the thermal pillar is on and in contact with the thermal bar.

Clause 14: A semiconductor device, comprising: a plurality of unit cells comprising a plurality of active devices on a substrate, the plurality of active devices having a first width in a first direction and being aligned along a first length in a second direction; a first metal layer patterned to form a plurality of thermal pads on the plurality of active devices; a second metal layer patterned to form first and second thermal bump ends and a thermal bump connected therebetween, the thermal bump having a second width in the first direction and a second length in the second direction, the thermal bump being formed on the plurality of thermal pads; and a thermal pillar formed on the thermal bump, wherein the plurality of active devices are thermally coupled to the thermal pillar through the plurality of thermal pads and the thermal bump, wherein the first and second thermal bump ends each has a width greater than the second width, a region between the first and second bump ends being divided into active and non-active regions, the active region being a portion of the region occupied by the thermal bump, and the non-active region being a remainder portion of the region, and wherein the second width and the second length of the thermal bump is oriented such that the active region overlaps the first width and the first length of the plurality of active devices.

Clause 15: The semiconductor device of Clause 14, wherein the thermal bump completely overlaps the plurality of active devices.

Clause 16: The semiconductor device of Clause 15, wherein the second width of the thermal bump is substantially equal to the first width of the plurality of active devices.

Clause 17: The semiconductor device of any of Clauses 14-16, wherein an active device of at least one unit cell is a bipolar transistor.

Clause 18: The semiconductor device of Clause 17, wherein the bipolar transistor is a heterojunction bipolar transistor (HBT).

Clause 19: The semiconductor device any of Clauses 17-18, wherein an emitter of the bipolar transistor is thermally coupled to the thermal bump through a thermal pad corresponding to the active device, and wherein a collector of the bipolar transistor is not electrically coupled to the thermal bump.

Clause 20: The semiconductor device of Clause 19, further comprising: a collector pad on and electrically coupled with the collector, the collector pad comprising: a first collector pad on the collector; and a second collector pad on the first collector pad, wherein the first collector pad is formed from the patterned first metal layer and the second collector pad is formed from the patterned second metal layer.

Clause 21: The semiconductor device of Clause 20, wherein the collector pad is formed on one or both sides of the emitter in the second direction.

Clause 22: The semiconductor device of any of Clauses 14-21, wherein at least one unit cell further comprises a capacitor on the substrate adjacent in the first direction to an active device of the at least one unit cell, and wherein at least a portion of the capacitor overlaps with the non-active width of the thermal bar.

Clause 23: The semiconductor device of Clause 22, wherein the capacitor comprises a lower plate, an upper plate, and a capacitor dielectric between the lower and upper plates, the lower plate being patterned from the first metal layer and the upper plate being patterned from the second metal layer.

Clause 24: The semiconductor device of Clauses 14-23, wherein at least one unit cell further comprises a resistor on the substrate adjacent in the first direction to an active device of the at least one unit cell, and wherein at least a portion of the resistor overlaps with the non-active width of the thermal bar.

Clause 25: The semiconductor device of Clauses 14-24, further comprising: one or more thermal fingers formed from the second metal layer, the one or more thermal fingers connected to and extending from the thermal bump in the first direction.

Clause 26: The semiconductor device of Clauses 14-25, wherein the plurality of thermal pads are on and in contact with the plurality of active devices, the thermal bump is on and in contact with the plurality of thermal pads, and the thermal pillar is on and in contact with the thermal bump.

Clause 27: A method of fabricating a semiconductor device, the method comprising: forming a plurality of unit cells comprising a plurality of active devices on a substrate, the plurality of active devices having a first width in a first direction and being aligned along a first length in a second direction; patterning a first metal layer to form a plurality of thermal pads on the plurality of active devices; patterning a second metal layer to form first and second thermal bump ends and a thermal bump connected therebetween, the thermal bump having a second width in the first direction and a second length in the second direction, the thermal bump being formed on the plurality of thermal pads; patterning a third metal layer to form a thermal bar on the thermal bump; and forming a thermal pillar on the thermal bar, wherein the plurality of active devices are thermally coupled to the thermal pillar through the plurality of thermal pads, the thermal bump, and the thermal bar, wherein the first and second thermal bump ends each has a width greater than the second width, a region between the first and second bump ends being divided into active and non-active regions, the active region being a portion of the region occupied by the thermal bump, and the non-active region being a remainder portion of the region, and wherein the second width and the second length of the thermal bump is oriented such that the active region overlaps the first width and the first length of the plurality of active devices.

Clause 28: The method of Clause 27, wherein the thermal bump completely overlaps the plurality of active devices, and wherein the second width of the thermal bump is substantially equal to the first width of the plurality of active devices.

Clause 29: A method of fabricating a semiconductor device, the method comprising: forming a plurality of unit cells comprising a plurality of active devices on a substrate, the plurality of active devices having a first width in a first direction and being aligned along a first length in a second direction; patterning a first metal layer to form a plurality of thermal pads on the plurality of active devices; patterning a second metal layer to form first and second thermal bump ends and a thermal bump connected therebetween, the thermal bump having a second width in the first direction and a second length in the second direction, the thermal bump being formed on the plurality of thermal pads; forming a thermal pillar formed on the thermal bump, wherein the plurality of active devices are thermally coupled to the thermal pillar through the plurality of thermal pads and the thermal bump, wherein the first and second thermal bump ends each has a width greater than the second width, a region between the first and second thermal bump ends being divided into active and non-active regions, the active region being a portion of the region occupied by the thermal bump, and the non-active region being a remainder portion of the region, and wherein the second width and the second length of the thermal bump is oriented such that the active region overlaps the first width and the first length of the plurality of active devices.

Clause 30: The method of Clause 29, wherein the thermal bump completely overlaps the plurality of active devices, and wherein the second width of the thermal bump is substantially equal to the first width of the plurality of active devices.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that-although a dependent claim can refer in the claims to a specific combination with one or one or more claims-other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:
1. A semiconductor device, comprising:
 a plurality of unit cells comprising a plurality of active devices on a substrate, the plurality of active devices having a first width in a first direction and being aligned along a first length in a second direction;

a first metal layer patterned to form a plurality of thermal pads on the plurality of active devices;
a second metal layer patterned to form first and second thermal bump ends and a thermal bump connected therebetween, the thermal bump having a second width in the first direction and a second length in the second direction, the thermal bump being formed on the plurality of thermal pads;
a third metal layer patterned to form a thermal bar on the thermal bump; and
a thermal pillar formed on the thermal bar,
wherein the plurality of active devices are thermally coupled to the thermal pillar through the plurality of thermal pads, the thermal bump, and the thermal bar,
wherein the first and second thermal bump ends each has a width greater than the second width, a region between the first and second thermal bump ends being divided into active and non-active regions, the active region being a portion of the region occupied by the thermal bump, and the non-active region being a remainder portion of the region, and
wherein the second width and the second length of the thermal bump is oriented such that the active region overlaps the first width and the first length of the plurality of active devices.

2. The semiconductor device of claim 1, wherein the thermal bump completely overlaps the plurality of active devices.

3. The semiconductor device of claim 2, wherein the second width of the thermal bump is substantially equal to the first width of the plurality of active devices.

4. The semiconductor device of claim 1, wherein an active device of at least one unit cell is a bipolar transistor.

5. The semiconductor device of claim 4, wherein the bipolar transistor is a heterojunction bipolar transistor (HBT).

6. The semiconductor device of claim 4,
wherein an emitter of the bipolar transistor is thermally coupled to the thermal bump through a thermal pad corresponding to the active device, and
wherein a collector of the bipolar transistor is not electrically coupled to the thermal bump.

7. The semiconductor device of claim 6, further comprising:
a collector pad on and electrically coupled with the collector, the collector pad comprising:
a first collector pad on the collector; and
a second collector pad on the first collector pad,
wherein the first collector pad is formed from the patterned first metal layer and the second collector pad is formed from the patterned second metal layer.

8. The semiconductor device of claim 7, wherein the collector pad is formed on one or both sides of the emitter in the second direction.

9. The semiconductor device of claim 1,
wherein at least one unit cell further comprises a capacitor on the substrate adjacent in the first direction to an active device of the at least one unit cell, and
wherein at least a portion of the capacitor is in the non-active region.

10. The semiconductor device of claim 9, wherein the capacitor comprises a lower plate, an upper plate, and a capacitor dielectric between the lower and upper plates, the lower plate being patterned from the first metal layer and the upper plate being electrically coupled to the patterned third metal layer.

11. The semiconductor device of claim 1,
wherein at least one unit cell further comprises a resistor on the substrate adjacent in the first direction to an active device of the at least one unit cell, and
wherein at least a portion of the resistor is in the non-active region.

12. The semiconductor device of claim 1, further comprising:
one or more thermal fingers formed from the second metal layer, the one or more thermal fingers connected to and extending from the thermal bump in the first direction into the non-active region.

13. The semiconductor device of claim 1, wherein the plurality of thermal pads are on and in contact with the plurality of active devices, the thermal bump is on and in contact with the plurality of thermal pads, the thermal bar is on and in contact with the thermal bump, and the thermal pillar is on and in contact with the thermal bar.

14. A semiconductor device, comprising:
a plurality of unit cells comprising a plurality of active devices on a substrate, the plurality of active devices having a first width in a first direction and being aligned along a first length in a second direction;
a first metal layer patterned to form a plurality of thermal pads on the plurality of active devices;
a second metal layer patterned to form first and second thermal bump ends and a thermal bump connected therebetween, the thermal bump having a second width in the first direction and a second length in the second direction, the thermal bump being formed on the plurality of thermal pads; and
a thermal pillar formed on the thermal bump,
wherein the plurality of active devices are thermally coupled to the thermal pillar through the plurality of thermal pads and the thermal bump,
wherein the first and second thermal bump ends each has a width greater than the second width, a region between the first and second thermal bump ends being divided into active and non-active regions, the active region being a portion of the region occupied by the thermal bump, and the non-active region being a remainder portion of the region, and
wherein the second width and the second length of the thermal bump is oriented such that the active region overlaps the first width and the first length of the plurality of active devices.

15. The semiconductor device of claim 14, wherein the thermal bump completely overlaps the plurality of active devices.

16. The semiconductor device of claim 15, wherein the second width of the thermal bump is substantially equal to the first width of the plurality of active devices.

17. The semiconductor device of claim 14, wherein an active device of at least one unit cell is a bipolar transistor.

18. The semiconductor device of claim 17, wherein the bipolar transistor is a heterojunction bipolar transistor (HBT).

19. The semiconductor device of claim 17,
wherein an emitter of the bipolar transistor is thermally coupled to the thermal bump through a thermal pad corresponding to the active device, and
wherein a collector of the bipolar transistor is not electrically coupled to the thermal bump.

20. The semiconductor device of claim 19, further comprising:
a collector pad on and electrically coupled with the collector, the collector pad comprising:
a first collector pad on the collector; and
a second collector pad on the first collector pad,
wherein the first collector pad is formed from the patterned first metal layer and the second collector pad is formed from the patterned second metal layer.

21. The semiconductor device of claim 20, wherein the collector pad is formed on one or both sides of the emitter in the second direction.

22. The semiconductor device of claim 14,
wherein at least one unit cell further comprises a capacitor on the substrate adjacent in the first direction to an active device of the at least one unit cell, and
wherein at least a portion of the capacitor overlaps with the non-active region.

23. The semiconductor device of claim 22, wherein the capacitor comprises a lower plate, an upper plate, and a capacitor dielectric between the lower and upper plates, the lower plate being patterned from the first metal layer and the upper plate being patterned from the second metal layer.

24. The semiconductor device of claim 14,
wherein at least one unit cell further comprises a resistor on the substrate adjacent in the first direction to an active device of the at least one unit cell, and
wherein at least a portion of the resistor overlaps with the non-active region.

25. The semiconductor device of claim 14, further comprising:
one or more thermal fingers formed from the second metal layer, the one or more thermal fingers connected to and extending from the thermal bump in the first direction.

26. The semiconductor device of claim 14, wherein the plurality of thermal pads are on and in contact with the plurality of active devices, the thermal bump is on and in contact with the plurality of thermal pads, and the thermal pillar is on and in contact with the thermal bump.

27. A method of fabricating a semiconductor device, the method comprising:
forming a plurality of unit cells comprising a plurality of active devices on a substrate, the plurality of active devices having a first width in a first direction and being aligned along a first length in a second direction;
patterning a first metal layer to form a plurality of thermal pads on the plurality of active devices;
patterning a second metal layer to form first and second thermal bump ends and a thermal bump connected therebetween, the thermal bump having a second width in the first direction and a second length in the second direction, the thermal bump being formed on the plurality of thermal pads;
patterning a third metal layer to form a thermal bar on the thermal bump; and
forming a thermal pillar on the thermal bar,
wherein the plurality of active devices are thermally coupled to the thermal pillar through the plurality of thermal pads, the thermal bump, and the thermal bar,
wherein the first and second thermal bump ends each has a width greater than the second width, a region between the first and second thermal bump ends being divided into active and non-active regions, the active region being a portion of the region occupied by the thermal bump, and the non-active region being a remainder portion of the region, and
wherein the second width and the second length of the thermal bump is oriented such that the active region overlaps the first width and the first length of the plurality of active devices.

28. The method of claim 27,
wherein the thermal bump completely overlaps the plurality of active devices, and
wherein the second width of the thermal bump is substantially equal to the first width of the plurality of active devices.

29. A method of fabricating a semiconductor device, the method comprising:
forming a plurality of unit cells comprising a plurality of active devices on a substrate, the plurality of active devices having a first width in a first direction and being aligned along a first length in a second direction;
patterning a first metal layer to form a plurality of thermal pads on the plurality of active devices;
patterning a second metal layer to form first and second thermal bump ends and a thermal bump connected therebetween, the thermal bump having a second width in the first direction and a second length in the second direction, the thermal bump being formed on the plurality of thermal pads; and
forming a thermal pillar on the thermal bump,
wherein the plurality of active devices are thermally coupled to the thermal pillar through the plurality of thermal pads and the thermal bump,
wherein the first and second thermal bump ends each has a width greater than the second width, a region between the first and second thermal bump ends being divided into active and non-active regions, the active region being a portion of the region occupied by the thermal bump, and the non-active region being a remainder portion of the region, and
wherein the second width and the second length of the thermal bump is oriented such that the active region overlaps the first width and the first length of the plurality of active devices.

30. The method of claim 29,
wherein the thermal bump completely overlaps the plurality of active devices, and
wherein the second width of the thermal bump is substantially equal to the first width of the plurality of active devices.

* * * * *